United States Patent
Bulovic et al.

(10) Patent No.: US 6,312,836 B1
(45) Date of Patent: *Nov. 6, 2001

(54) COLOR-TUNABLE ORGANIC LIGHT EMITTING DEVICES

(75) Inventors: Vladimir Bulovic, Metuchen; Stephen R. Forrest, Princeton, both of NJ (US); Mark E. Thompson, Anaheim, CA (US)

(73) Assignees: The Trustees of Princeton University, Princeton, NJ (US); The University of Southern California, Los Angeles, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/207,799

(22) Filed: Dec. 9, 1998

Related U.S. Application Data

(63) Continuation-in-part of application No. 09/152,962, filed on Sep. 14, 1998, now Pat. No. 6,210,814, which is a continuation-in-part of application No. 09/058,142, filed on Apr. 10, 1998.

(51) Int. Cl.[7] ............................ H05B 33/14; H05B 33/10

(52) U.S. Cl. ......................... 428/690; 428/917; 427/66; 313/504; 313/506; 257/94

(58) Field of Search .............................. 428/690, 917, 428/704; 427/66; 313/502, 506, 504; 257/94

(56) References Cited

U.S. PATENT DOCUMENTS

| | | | |
|---|---|---|---|
| 4,769,292 | * | 9/1988 | Tang et al. .......................... 428/690 |
| 5,281,489 | * | 1/1994 | Mori et al. ......................... 428/690 |

(List continued on next page.)

OTHER PUBLICATIONS

Berggren, M., et al., "Light Amplification in Organic Thin Films Using Cascade Energy Transfer," *Nature* 389, Oct. 2, 1997, pp. 466–469.

V. Bulović, et al., "Weak microcavity effects in organic light emitting devices", *Physical Review B*, vol. 58, No. 7, Aug. 15, 1998, pp. 3730–3740.

(List continued on next page.)

*Primary Examiner*—Marie Yamnitzky
(74) *Attorney, Agent, or Firm*—Kenyon & Kenyon

(57) ABSTRACT

A new method for tuning the emission spectrum of OLEDs while retaining a high luminescence efficiency wherein the emission spectrum of a polar luminescent molecule is wavelength shifted by as much as 70 nm when doped into a conductive host in a vacuum-deposited molecular organic light emitting device. The effect may be attributed to changes in the average dipole moment of the host thin film that are induced by the addition of highly dipolar dopant molecules. This phenomenon may be referred to as a "solid state solvation effect" in analogy to similar effects previously identified in solution chemistry. In experiments using singly doped devices, different concentrations of a polar laser dye known as DCM2 are doped in non-polar triaryl amine conductive host films. In these experiments, DCM2 performs the dual role of functioning both as the luminescent center and as the source of the increased spatially averaged dipole moment. In a second set of experiments using dual-doped devices, DCM2 is employed only as the luminescent center in a non-polar host, while a second polar dopant, aluminum tris(8-hydroxyquinoline) ($Alq_3$), is introduced to generate the local dipole moment. By changing the concentration of $Alq_3$, while keeping the DCM2 concentration fixed, the OLED emission may be tuned over a range of 30 nm. For the singly doped devices, the external luminescence quantum efficiency, $\eta$, decreases with dopant concentration due to aggregation induced quenching. However, for the dual-doped devices, $\eta$ increases with an increase in the bathochromic shift.

21 Claims, 19 Drawing Sheets

U.S. PATENT DOCUMENTS

| | | | |
|---|---|---|---|
| 5,540,999 | * 7/1996 | Yamamoto et al. | 428/411.1 |
| 5,554,220 | 9/1996 | Forrest et al. | 117/88 |
| 5,703,436 | 12/1997 | Forrest et al. | 313/506 |
| 5,707,745 | 1/1998 | Forrest et al. | 428/432 |
| 5,717,289 | 2/1998 | Tanaka | 313/503 |

OTHER PUBLICATIONS

Bulović, V., et al., "Bright, saturated, red–to–yellow organic light emitting devices based on polarization–induced spectral shifts", *Chemical Physics Letters*, 287, May 1, 1998, pp. 455–460.

Cheng, L.T., et al., *Journal of Physical Chemistry*, 95, 10631–10643 (1991)*, (no month given).

Cheng, L.T., et al., *Journal of Physical Chemistry*, 95, 10643–10652 (1991), (no month given).

Forrest, S.R., et al., Laser Focus World, Feb. 1995, pp. 99, 101, 102,104, 106,107.

Garbuzov, D.Z., et al., *Chem. Phys. Lett*, 249, pp. 433–437 (1996), (no month given).

Kalinowski, J., et al., "Electroabsorption Study of Excited States in Hydrogen–bonding Solids: Epindolidone and Linear Transquinacridone," *Chem. Phys.*182, (1994), pp. 341–352 (no month given).

Kido, J., et al., *Appl. Phys. Lett.*, 65, Oct. 24, 1994, pp. 2124–2126.

Kido, J., et al., *J. Alloys and Compounds*, 192, pp. 30–33, (no month given).

Kido, J., et al., *Applied Physics Letters*, vol. 73, No. 19, Nov. 9, 1998, pp. 2721–2723.

Kijima, Y., et al., *IEEE Transactions on Electron Devices*, vol. 44, No. 8,8/97, pp. 1222–1227.

Lewis, D.F., et al., *Chem. Soc. Chem. Commun.*, 1046–1047 (1974), (no month given).

Littman, J., et al., *J., Appl. Phys.*, 72, Sep. 1, 1992, pp. 1957–1960.

Martin, M., et al., "Ultrafast Intramolecular Charge Transfer in the Merocyanine Dye DCM," *Chem. Phys.* 192, pp. 367–377 (1995), (no month given).

Sano, T., et al., *Japan J. Appl. Phys.*, 34, 04/95, pp. 1883–1887.

Schmidbaur, H., et al., *Z. Naturforsch*, B 46, 901 (1991), (no month given).

Shen, Z., et al., *Science*, 276, Jun. 27, 1997, pp. 2009–2011.

Tang, C.W., et al., *Appl. Phys. Lett.* 51, Sep. 21, 1987, pp. 913–915.

Tang, C.W., et al., *J. Appl. Phys.*, 65, May 1, 1989, pp. 3610–3616.

Tasch, S., et al., *Adv. Mater.*, 9, pp. 33–36 (1997), (no month given).

Tsutsui, T., et al., *Appl. Phys. Lett.*, 65, Oct. 10, 1994, pp. 1868–1870.

* cited by examiner

COLOR-TUNABLE ORGANIC LIGHT EMITTING DEVICES

This is a continuation-in-part application of U.S. application Ser. No. 09/152,962, filed Sep. 14, 1998, now U.S. Pat. No. 6,210,814, which is a continuation-in-part application of U.S. application Ser. No. 09/058,142, filed Apr. 10, 1998.

GOVERNMENT RIGHTS

This invention was made with Government support under Contract No. F33615-94-1-1414 awarded by DARPA. The government has certain rights in this invention.

FIELD OF THE INVENTION

The present invention is directed to organic light emitting devices (OLEDs) comprising an emissive layer. In particular, the wavelength of light emitted by the emissive layer may be tuned by varying the average local dipole moment experienced by the emissive molecule or chromophore, for example, by varying the concentration of polar dopant molecules in the emissive layer or by varying the host material itself.

BACKGROUND OF THE INVETION

Organic light emitting devices (OLEDs) are comprised of several organic layers in which one of the layers is comprised of an organic material that can be made to electroluminesce, by applying a voltage across the device. C. W. Tang et al., *Appl. Phys. Lett.* 51, 913 (1987). Certain OLEDs have been shown to have sufficient brightness, range of color and operating lifetimes for use as a practical alternative technology to LCD-based full color flat-panel displays. S. R. Forrest, P. E. Burrows and M. E. Thompson, Laser Focus World, February 1995. Since many of the thin organic films used in such devices are transparent in the visible spectral region, they allow for the realization of a completely new type of display pixel in which red (R), green (G), and blue (B) emitting OLEDs are placed in a vertically stacked geometry to provide a simple fabrication process, a small R-G-B pixel size, and a large fill factor.

A transparent OLED (TOLED), which represents a significant step toward realizing high resolution, independently addressable stacked R-G-B pixels, was reported in U.S. Pat. No. 5,703,436, Forrest et al. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg—Ag-ITO electrode layer for electron-injection. A device was disclosed in which the ITO side of the Mg—Ag-ITO electrode layer was used as a hole-injecting contact for a second, different color-emitting OLED stacked on top of the TOLED. Each layer in the stacked OLED (SOLED) was independently addressable and emitted its own characteristic color, red or blue. This colored emission could be transmitted through the adjacently stacked transparent, independently addressable, organic layer, the transparent contacts and the glass substrate, thus allowing the device to emit any color that could be produced by varying the relative output of the red and blue color-emitting layers.

U.S. Pat. No. 5,707,745, Forrest et al, disclosed an integrated SOLED for which both intensity and color could be independently varied and controlled with external power supplies in a color tunable display device. U.S. Pat. No. 5,707,745, thus, illustrates a principle for achieving integrated, full color pixels that provide high image resolution, which is made possible by the compact pixel size. Furthermore, relatively low cost fabrication techniques, as compared with prior art methods, may be utilized for making such devices.

Such devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers between an anode and a cathode. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the HTL, while the cathode injects electrons into the ETL. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. These excitons are trapped in the material which has the lowest energy. Recombination of the short-lived excitons may be visualized as an electron dropping from a lowest unoccupied molecular orbital (LUMO) to a highest occupied molecular orbital (HOMO), with relaxation occurring, under certain conditions, preferentially via a photoemissive mechanism.

The materials that function as the ETL or HTL of an OLED may also serve as the medium in which exciton formation and electroluminescent emission occur. Such OLEDs are referred to as having a "single heterostructure" (SH). Alternatively, the electroluminescent material may be present in a separate emissive layer between the HTL and the ETL in what is referred to as a "double heterostructure" (DH).

In a single heterostructure OLED, either holes are injected from the HTL into the ETL where they combine with electrons to form excitons, or electrons are injected from the ETL into the HTL where they combine with holes to form excitons. Because excitons are trapped in the material having the lowest energy gap, and commonly used ETL materials generally have smaller energy gaps than commonly used HTL materials, the emissive layer of a single heterostructure device is typically the ETL. In such an OLED, the materials used for the ETL and HTL should be chosen such that holes can be injected efficiently from the HTL into the ETL. Also, the best OLEDs are believed to have good energy level alignment between the HOMO levels of the HTL and ETL materials.

In a double heterostructure OLED, holes are injected from the HTL and electrons are injected from the ETL into the separate emissive layer, where the holes and electrons combine to form excitons.

Various compounds have been used as HTL materials or ETL materials. HTL materials mostly consist of triaryl amines in various forms which show high hole mobilities ($\sim 10^{-3}$ cm$^2$/Vs). One common HTL material is 4,4'-bis[N-(1-naphthyl)-N-phenyl-amino]biphenyl ($\alpha$-NPD), having the structure:

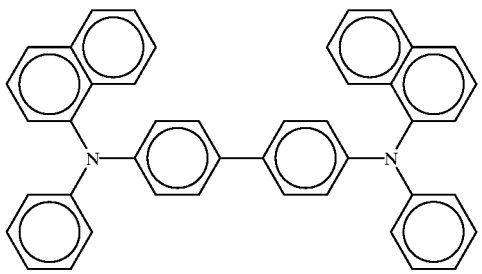

There is somewhat more variety in the ETLs used in OLEDs. A common ETL material is aluminum tris(8-hydroxyquinolate) (Alq$_3$), having the structure:

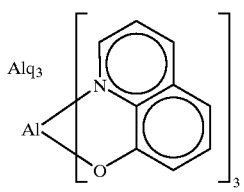

Other common ETL materials include oxadiazole, triazole, and triazine.

A number of technological challenges related to OLEDs need further attention, including increasing device lifetime and developing OLEDs that emit bright, saturated colors. Typically, the broad electroluminescence (EL) spectrum of OLEDs results in unsaturated emission colors which can be narrowed using, for example, an absorption filter or microcavity. Unfortunately, these methods can lead to a reduction in the OLED quantum efficiency or a strong angular dependence of the emitted color. It is therefore desirable to develop an OLED which emits a saturated color without the assistance of such external filters. Achievement of saturated and bright red OLEDs has proven to be particularly difficult.

Dyes have been used as dopants in the emissive layers of OLEDs to affect the wavelength and increase the efficiency of light emission. Molecules of the host transfer excitons to molecules of the dye through a non-radiative process. The exciton then recombines on the dye, and emits a photon having a wavelength characteristic of the dye, as opposed to the host. Several of these dyes are polar molecules, ie., are molecules having a significant dipole moment, such as DCM1 and DCM2. DCM1 has a molecular structure represented by the formula:

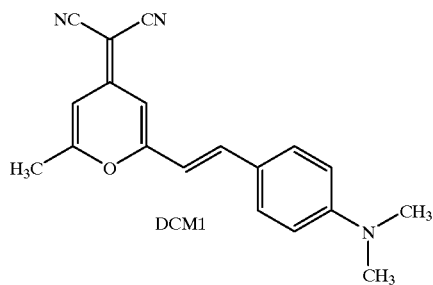

DCM2 has a structure represented by the formula:

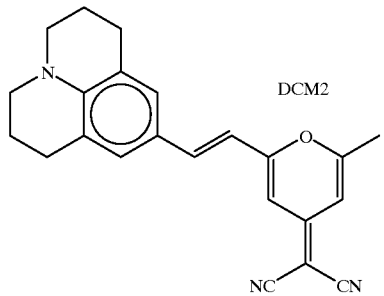

DCM2 has been described as a red emitting chromophore useful in OLED applications. C. W. Tang et al., Electroluminescence of doped organic thin films, J. Appl. Phys. 65, 3610 (1989). Indeed, OLEDs based on Alq$_3$ doped with DCM2 are shown to exhibit very high brightness. Tang et al. also observed that the emission of Alq$_3$ doped with DCM1 undergoes a spectral shift towards higher wavelengths as the concentration of DCM1 is increased, and attributed this spectral shift to excimer formation. Id. Tang et al. also observed that, with increasing concentration of DCM1, the efficiency of the emission at first increases, and then decreases.

DCM2 has also been described as showing promise as a laser material. M Berggren et al., Light amplification in organic thin films using cascade energy transfer, Nature 389, 466 (1997).

In studies of solutions of quinacridone in polar solvents, J. Kalinowski et al., Electroabsorption study of excited states in hydrogen-bonding solids: epindolidone and linear trans-quinacridone, Chem. Phys. 182, 341 (1994), spectral shifting has been attributed to hydrogen bonding in solution.

A red shift in the emission of DCM1 has been observed for DCM1 in polar solvents. M. Martin et al., Ultrafast intramolecular charge transfer in the merocyanine dye DCM, Chem. Phys. 192, 367 (1995).

SUMMARY OF THE INVENTION

A method is provided for tuning the wavelength of light emitted by an organic light emitting device. An emissive dopant molecule is selected, adapted to emit light when present as a dopant in an emissive layer of the organic light emitting device. The wavelength of light emitted by said emissive dopant molecule depends on the local dipole moment of the emissive layer, that is, on the average local dipole moment experienced by the emissive dopant molecule. The local dipole moment of the emissive layer that would result in said emissive dopant molecule emitting a desired wavelength of light is determined, and an emissive layer is fabricated, doped with the emissive dopant molecule and having the local dipole moment that results in the emissive dopant molecule emitting the desired wavelength of light. The local dipole moment may be fixed by selecting a host material with a prescribed dipole moment, by varying the concentration of the emissive dopant molecule and/or by varying the concentration of a polarization dopant molecule.

In an organic light emitting device comprising a heterostructure for producing luminescence, an emissive layer is provided, having a host material, an emissive molecule, which is present as a dopant in said host material and is adapted to luminesce when a voltage is applied across the heterostructure, and a polarization molecule, which is present as a dopant in said host material and has a dipole moment that affects the wavelength of light emitted when said emissive dopant molecule luminesces. The emission wavelength depends on the dipole moment of the host material, the concentration of the polarization dopant molecule, and the concentration of the emissive molecule in the host material.

$Alq_3$, known in the art as a host material, can be used in the invention as a host material. Previously unknown in the art as host materials, quinoline-based materials for use in the invention are $Mq_4$ and $Mq_2R_2$, as illustrated below.

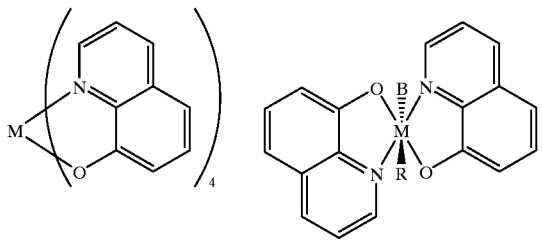

$Mq_4$, M=group 4 or 14 metal $Mq_2R_2$, M=group 4 or 14 metal

R=alkyl, aryl, alkoxy, halide, pseudohalide, etc.

B=alkyl, aryl, alkoxy, halide, pseudohalide, etc.

A group 4 metal is a metal selected from group 4 of the periodic table, which group includes elements under titanium. A group 14 metal is a metal selected from group 14 of the periodic table, which group includes elements under carbon. R can be the same or different from B.

The polarization dopant molecule can be selected from the group consisting of yellow stilbene, N,N-dimethylpaanitroaniline ("PNA"), polar-1, polar-2, polar-3 and polar4 as defined below:

TABLE

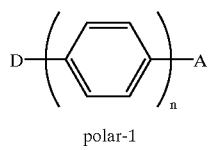

polar-1

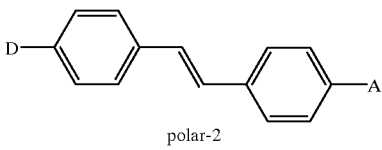

polar-2

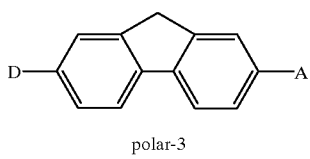

polar-3

TABLE-continued

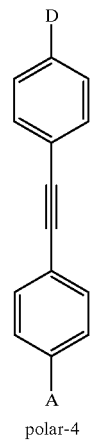

polar-4

| type | D | A | n | $\mu$ (D) | $\lambda_{max}$ (nm) | reference |
|---|---|---|---|---|---|---|
| polar-1 | $(CH_3)_2N$ | CN | 1 | 5.6 | 290 | a |
| polar-1 | $(CH_3)_2N$ | $NO_2$ | 1 | 6.4 | 376 | a |
| polar-1 | $(CH_3)_2N$ | CHO | 1 | 5.1 | 326 | a |
| polar-1 | $(CH_3)_2N$ | $COCF_3$ | 1 | 5.9 | 356 | a |
| polar-1 | $CH_3O$ | CN | 1 | 4.8 | 248 | a |
| polar-1 | $CH_3O$ | $NO_2$ | 1 | 4.6 | 303 | a |
| polar-2 | $(CH_3)_2N$ | CN | — | 5.7 | 382 | a |
| polar-2 | $(CH_3)_2N$ | $NO_2$ | — | 6.6 | 427 | a |
| polar-2 | $CH_3O$ | CN | — | 3.8 | 340 | a |
| polar-2 | $CH_3O$ | $SO_2C_6F_{13}$ | — | 7.8 | 347 | a |
| polar-2 | $CH_3O$ | $NO_2$ | — | 4.5 | 364 | a |
| polar-3 | $CH_3O$ | $NO_2$ | — | 4.7 | 356 | b |
| polar-3 | $(CH_3)_2N$ | $NO_2$ | — | 6.0 | 417 | b |
| polar-3 | H | CN | — | 3.9 | 284 | b |
| polar-4 | $(CH_3)_2N$ | CN | — | 6.1 | 372 | b |
| polar-4 | $CH_3S$ | CN | — | 4.0 | 333 | b |
| polar-4 | $CH_3O$ | $NO_2$ | — | 4.4 | 356 | b |
| polar-4 | $CH_3S$ | $NO_2$ | — | 4.0 | 362 | b |
| polar-4 | $(CH_3)_2N$ | $NO_2$ | — | 6.1 | 415 | b |

Reference a is L. T. Cheng, W. Tam, S. H. Stevenson, G. R. Meredith, G. Rikken, S. R. Marder, Journal of Physical Chemistry, 1991, 95, 10631–10643. Reference b is L. T. Cheng, T. Tam, S. R. Marder, A. E. Steigman, G. Rikken, C. W. Spangler, Journal of Physical Chemistry, 1991,95, 10643–10652.

The aromatic molecule at positions other than those occupied by D and A may be substituted by either hydrogen or alkyl. The depictions of polar-1, polar-2, polar-3 and polar4 include geometric isomers created by different substitution patterns of D and A, which isomers appropriately effect the wavelength of light emitted when the emissive dopant luminesces.

Thus, representative examples of suitable light emitting diodes comprise the following: the host material may be $Alq_3$, $Mq_4$, $Mq_2R_2$, triaryl amines such as $\alpha$-NPD or TPD, or other suitable host materials well-known to those skilled in the art, the emissive dopant molecule may be selected from the group consisting of DCM1 and DCM2 or other suitable emissive dopant molecule known to one of ordinary skill in the art, and the polarization dopant molecule may be yellow stilbene, N,N-dimethylparanitroaniline ("PNA"), polar-1, polar-2, polar-3, or polar4 as defined above, or any other molecule that has a net dipole moment in its ground or excited state when doped in the host material. One can use $Mq_4$ or $Mq_2R_2$ in organic light emitting devices with other suitable polarization dopant molecules. One can make organic light emitting diodes by using a method based on selecting a suitable host material and polarization dopant molecule chosen from the compounds disclosed herein.

Further objectives and advantages of the subject invention will be apparent to those skilled in the art from the detailed description of the disclosed invention.

DETAILED DESCRIPTION

Figure 1:
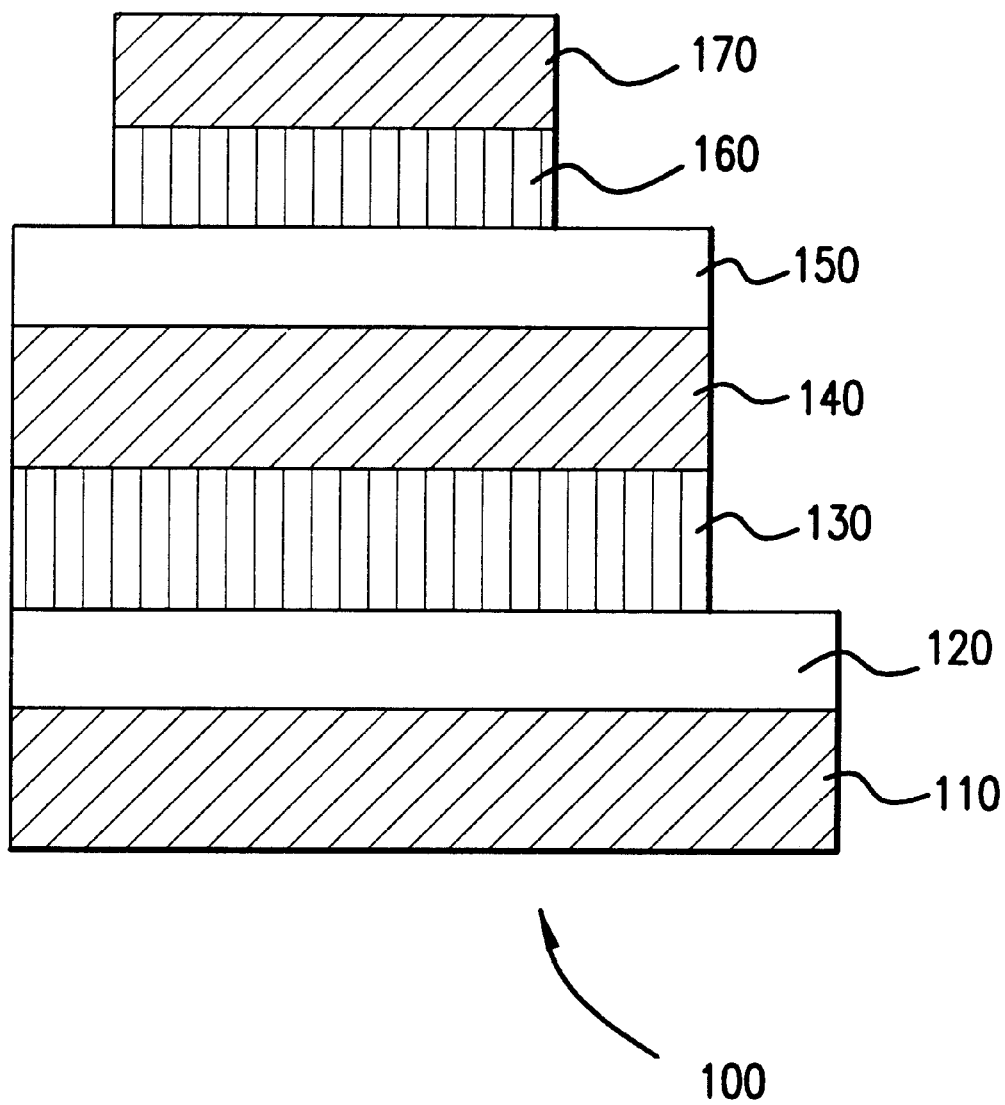
FIG. 1 shows a double heterostructure organic light emitting device.

The subject invention will now be described in detail for specific preferred embodiments of the invention, it being understood that these embodiments are intended only as illustrative examples and the invention is not to be limited thereto.

A method is provided for tuning the wavelength of light emitted by an organic light emitting device. An emissive dopant molecule is selected, adapted to emit light when present as a dopant in an emissive layer of the organic light emitting device. The wavelength of light emitted by said emissive dopant molecule depends on the local dipole moment of the emissive layer. The local dipole moment of the emissive layer that would result in said emissive dopant molecule emitting a desired wavelength of light is determined, and an emissive layer is fabricated, doped with the emissive dopant molecule and having the local dipole moment that results in the emissive dopant molecule emitting the desired wavelength of light.

While not intending to be limited by any particular theory or mechanism for explaining exactly how or why the fields generated by neighboring polar molecules, referred to herein as the "local dipole moment," causes a shift in the wavelength of light emitted by an emissive dopant molecule, it is believed that the local dipole moment affects the orbital structure of an emissive molecule to the extent that the energy levels of the molecule may shift. The inventors' analysis shows that polar molecules in the immediate vicinity of the emissive molecules, that is, within about 50–100 Å, would provide significant contributions to the average local dipole moment experienced by the emissive molecule. In particular, it is believed that the gap between the lowest unoccupied molecular orbital (LUMO) and highest occupied molecular orbital (HOMO) of a polar molecule may be decreased, for example, as the local dipole moment increases, because the local dipole moment affects the distribution of charge on the polar molecule, which will in turn affect the energy level positions. When an excited electron falls from the LUMO to the HOMO, a photon is emitted having an energy determined by the gap between the LUMO and HOMO. It is therefore possible to control the wavelength of light emitted by an emissive molecule in an OLED by controlling the gap between the LUMO and HOMO.

In solutions, solvatochromism is generally assigned to the change in the solute dipole moment upon excitation and the interaction of the dipole moment with a polarizable enviromnent C. Reichardt, Solvents and Solvent Effects in Organic Chemistry, VCH Verlagsgesellschaft mbH, D-6940 Weinheim, Germany (1988). The same explanation is consistent with the observations disclosed herein for doped organic thin films, hence this condensed phase phenomenon is referred to as the "solid-state solvation effect" (SSSE). Theories of solvation effects principally assume that the chemical states of the isolated and solvated chromophore-containing molecules are the same, and processes such as solvent-solute charge transfer, solvent-dependent aggregation, ionization, complexation, or isomerization do not occur, Reichardt. Simply, solvation is considered as a physical perturbation of the relevant molecular states of the chromophore due to the presence of the solvent.

Spectroscopic studies on solutions of polar molecules in polar solvents have shown that the peak luminescence ($\lambda_{max}$) and peak absorption wavelength can be affected by the dipole moment of the solvent molecules. Both bathochromic (red) and hypsochromic (blue) shifts in ($\lambda_{max}$) have been observed as the solvent polarity increased Reichardt. The theoretical treatments of this phenomenon are generally limited by the complexity of the solute-solvent system which involves dipole-dipole, dipole-induced dipole, and hydrogen bonding interactions. Furthermore, even if all physical interactions were well described, the detailed arrangement of solvent atoms around the solute is not well known, especially when the solute is in a short-lived excited state.

Qualitative treatments of the problem, however, give a reasonable agreement with experimental measurements. In essence, it is found that the polar solvent will more strongly influence the more polar state of the molecule. Since molecular electronic transitions lead to redistribution of charge, the dipole moment of the ground state and an excited state of a molecule will, in general, be different. If the excited state of the molecule has a larger dipole moment than the ground state, an increase in solvent polarity will more strongly stabilize the excited state, lowering its energy, and red shifting $\lambda_{max}$, Reichardt. This is the case for the organic laser dye DCM2 used in this study, V. Bulović, V. B. Khalfin, G. Gu, P. E. Burrows and S. R. Forrest, Physical Review (1998), Bulović I. Conversely, if the dipole moment of the ground state is larger than that of the excited state the ground state is more stabilized upon increasing the solvent polarity and a blue shift in $\lambda_{max}$ is observed. These solvent effects are such a prevalent phenomenon that they are used as a diagnostic of molecular transitions. For example, a blue shift in $\lambda_{max}$ with the increase in solvent polarity suggests a $\pi^* \to n$ transition in the luminescence process, where $\pi^*$ corresponds to an antibonding molecular orbital and n to a non-bonding electron orbital. Similarly a $\pi^* \to \pi$ transition typically results in a bathochromic shift $\lambda_{max}$, Reichardt.

Prior explanations for the red-shifting of the emission of certain dopants are not consistent with the inventors' observations. For example, excimer formation would not result in the continuous, red shift of the EL spectrum shown in FIG. 2, while hydrogen bonding in solution is not possible for DCM2 molecules.

A local dipole moment is expected to affect the LUMO-HOMO gap of both non-polar and polar molecules (a molecule having a high dipole moment). However, it is expected that a local dipole moment will have a greater effect on the LUMO-HOMO gap of a polar molecule, relative to a less polar or non-polar molecule. As a result, the red-shift in the emission of the emissive dopant molecule due to a local dipole moment is expected to be greater if the emissive dopant molecule is a polar molecule. It is therefore expected a lower local dipole moment would be required to achieve a particular spectral shift for emissive dopant molecules having a high dipole moment. It is therefore preferable, that the emissive dopant molecule has a dipole moment above about 5 debyes, more preferably above about 7 debyes, and most preferably above about 10 debyes.

The present invention is, thus, directed to a method of fabricating an OLED that electroluminesces with the emission peak being in a prescribed spectral region, in particular, by adjusting the average dipole moment experienced by the chromophore in the emissive layer. The average dipole moment experienced by the chromophore may be adjusted to have the desired value by selecting a host/dopant combination wherein the host material as well as the dopant material, or materials, may be individually selected according to that material's individual polarization properties. The dopant material may include one or more of an emissive material, a polarization material, an energy transfer material for promoting efficient cascade energy transfer and/or a stabilizing material, for example, for stabilizing against recrystallization. The concentration of these dopant materials is selected so as to adjust the average dipole moment experienced by the chromophore to have a value that causes the EL emission peak to be produced in the desired spectral region. Such materials may include either small molecules that may be vacuum deposited or polymeric materials that may be present either as the host or dopant material.

Whenever polymers are used for polarization shifting, the polymer may be present, for example, as an emissive polymer in combination with a molecular dopant. Such polymers may be selected, for example, from those polymers that show a strong solvent dependence on their PL spectra, such as alkoxy-substituted phenylenevinylene compounds, e.g., MEH-PPV: 2,5-dialkoxy-1,4-phenylenevinylene. In fact, polarization shifting may be observed for a wide range of polymers including, e.g., polythiophenes or polyphenyls. While there have been reports of observing different EL spectra depending on what solvent the polymers are spin cast from, these effects have been ascribed to different degrees of aggregation of the polymer. Another explanation is that some of the solvent may be left behind in the film and the dipole of the solvent molecule itself polarization shifts the emission. The polarization effect is preferably produced in emissive polymers by low volatility molecular species, not solvents, in order to make the effect more reproducible and controllable.

Another approach using polymers for polarization shifting is to add polar side chains onto a polymer strand. This would be expected to act in substantially the same way as having the molecules dispersed in the film. Having the polar side chains hanging off of the chain would not be expected to adversely affect the OLED performance and the concentration of dopant could be adjusted by adding different amounts of the polymer or varying the degree of loading of the polar groups on the polymer backbone. Preferably, these polar groups would have a high dipole moment and relatively small size.

A large number of side chain polymers have been developed for nonlinear optics. These polymers have chromophores with very high dipole moments bound to them as side chains. The chromophores have large dipole moments associated with them so that they can be poled into an aligned state with an external electric field. Thus, the polymers that are used for polarization shifting may be selected from the large number of polymers that may be used in second order nonlinear optics. Another class of polymeric materials that may be used include ferroelectric polymeric materials that have polar groups substituted along the polymer chain.

The present method for fabricating the emissive layers of an OLED permits the same host and dopant materials to be used to produce emission peaks in very different regions of the spectrum simply by varying the relative concentrations of the host and dopant materials in each OLED. Such a method permits fabrication of stacked OLEDs in which each OLED in the stack includes an emission layer using the same host and dopant materials as are present in the emission layer of the other OLED or OLEDs in the stack, thus simplifying and reducing the cost of the stacked-OLED manufacturing process.

The inventors have demonstrated a shift in the spectral emission of OLEDs having an emissive layer of aluminum tris(8-hydroxyquinoline) ($Alq_3$) doped with DCM2, by changing the concentration of DCM2. As the concentration of DCM2 in $Alq_3$ was increased, the spectral emission changed from green to red, while the spectral width remained constant. This effect may be due to an increase in the local dipole moment of the $Alq_3$:DCM2 layer with increasing concentration of DCM2, a polar molecule. In particular, increasing the concentration of DCM2 increases the local dipole moment, which affects the LUMO-HOMO gap of DCM2, resulting in an emission that is red-shifted. However, the increase in DCM2 concentration also results in increase in formation of DCM2 aggregates. Aggregate formation at high DCM2 concentrations provides sites for non-radiative recombination (e.g. excimers), which reduce the possibility for radiative emission and decreases quantum efficiency.

A "polarization dopant molecule," i.e., a molecule that contributes to the local dipole moment, separate from the emissive dopant molecule, may be used as a dopant to increase the local dipole moment of the host without increasing the concentration of the emissive dopant molecule, thereby avoiding the formation of aggregates of the emissive dopant molecule and the resultant quenching and decrease in efficiency. Preferably, the polarization dopant molecule has a high dipole moment, more preferably has a dipole moment above about 5 debyes, more preferably above about 7 debyes, and most preferably above about 10 debyes. A high dipole moment allows the local dipole moment of the host to be changed using only small concentrations of the polarization dopant molecule.

The polarization dopant molecule is preferably transmissive in the spectral range corresponding to the OLED emission, and does not significantly interfere with the light emitted by the emissive dopant molecule. For example, a polarization dopant molecule having a LUMO-HOMO gap that is greater than the energy of a photon emitted by the emissive dopant molecule is unlikely to absorb such photons. Preferably, the polarization dopant molecule does not act as a carrier trap in $Alq_3$, and does not affect the conduction properties or current-voltage characteristics of the OLED. Preferably, the polarization dopant molecule does not provide radiative or non-radiative recombination sites for excitons. For example, a polarization dopant molecule having a LUMO-HOMO gap that is greater than the energy of an exciton on a molecule of the host is unlikely to accept the transfer of such an exciton.

The polarization dopant molecule may be doped into the emissive layer of an OLED at a high concentration, up to about 50%, without significantly adversely affecting OLED performance. However, at very high concentrations of dopant, above about 50%, OLED performance may be adversely affected by the decrease in the amount of the host and the emissive dopant molecule. The polarization dopant molecule is therefore preferably present in a concentration less than about 50%, and more preferably less than about 20%. Where the polarization dopant molecule has a dipole moment within the preferred ranges, it should be possible to attain the local dipole moment required to achieve emission of a particular wavelength from the emissive dopant molecule at concentrations of the polarization dopant molecule that are significantly less than about 20%.

One molecule that could be used as the polarization dopant molecule is yellow stilbene, having the structure:

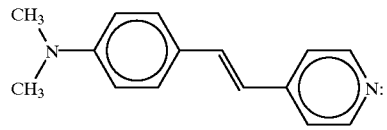

The local dipole moment in the emissive layer of the OLED may therefore be controlled by changing the concentration of the polarization dopant molecule, which in turn will affect the wavelength of light emitted by the emissive dopant molecule. Because the color tuning of the OLED is achieved by changing the concentration of the polarization dopant molecule, different colors of emission may be achieved while holding constant the concentration of the emissive dopant molecule. Preferably, the concentration of the emissive dopant molecule is low, just sufficient to maximize energy transfer from the host to the emissive dopant molecule, and the efficiency of the OLED. Because aggregates tend to form at higher concentrations of the emissive dopant molecule, keeping the concentration low keeps the density of aggregates low, and the OLED efficiency is kept high. For example, if the host is $Alq_3$ and the emissive dopant molecule is DCM2, the concentration of DCM2 is preferably between about 0.3% and 20%, more preferably between about 1% and 10%, and most preferably about 1%. If the emissive dopant molecule is also polar, the local dipole moment would depend on the concentrations of both the emissive dopant molecule and the polarization dopant molecule.

One or more emissive dopant molecules may be used, for example to achieve an OLED that emits white light. One or more polarization dopant molecules may be used, for example to achieve a higher local dipole moment than would be possible using only one polarization dopant molecule.

Over a large volume, the net dipole moment caused by dopants such as DCM2 averages to zero, because the molecules in the solid solution are randomly distributed. However, because the dipole field decreases as $1/r^3$, where r is the distance between dipoles, there is a net local dipole moment contribution from neighboring DCM2 molecules which, on average, influences the spectral emission of radiating DCM2 molecules. This local dipole moment can also be inferred from the dielectric constant for DCM2, which is somewhat higher than is typically observed for nonpolar molecular solids. As will be shown below, these local variations in the distribution of dipoles is also reflected in the luminescent efficiency of lightly DCM2 doped $Alq_3$ films.

The luminescence of DCM2 molecules is preceded by non-radiative Förster transfer of energy from $Alq_3$ to DCM2. The rate of energy transfer depends on the distance R between the host ($Alq_3$) and the guest (DCM2) molecules, and is given by Equation (1):

$$K_{H-G}(R) = \left(\frac{1}{\tau}\right)\left(\frac{R_0}{R}\right)^6 \tag{1}$$

where $R_0$ is the Förster radius, i.e., the average distance between host and dopant molecules, and $\tau$ is the average host exciton lifetime for recombination in the absence of energy transfer, corresponding to rate $K_\pi=1/\tau$. When $R=R_0$ then $K_{H-G}=K_H$, and the probability that an exciton will recombine at the host is equal to its transfer probability. Equation (1) describes the interaction of a single host molecule with a single guest molecule. In a doped thin film, however, the exciton on the host can interact with a distribution of dopant molecules, and hence the total rate of transfer is obtained by integrating over the film volume:

$$K_{H-G}^{TOT} = 4\pi \int_{R=2a}^{R=\infty} \left(\frac{1}{\tau}\right)^6 \rho_a Q R^2 = \left(\frac{1}{\tau}\right)\frac{R_0^6 Q}{8a^6} \tag{2}$$

Here, a is the radius of an $Alq_3$ molecule, and $\rho_\alpha=3/(4\pi\alpha^3)$. The probability for exciton transfer from a host to a dopant molecule is then:

$$P_{H-G} = \frac{K_{H-G}^{TOT}}{K_H + K_{H-G}^{TOT}} \tag{3}$$

From Equations (2) and (3), and using data measured from $Alq_3$:DCM2 OLEDs, $R_0$ for those OLEDs can be estimated by determining the percentage of EL from $Alq_3$ and DCM2 as a flunction of the doping fraction, Q. A linear fit of the spectrum of a $Alq_3$:1% DCM2 OLED shows that 15% of the EL is due to direct radiative recombination of excitons on $Alq_3$, resulting in a small shoulder in the spectrum of such an OLED at $\lambda$=520 nm (See FIG. 2). Using an internal luminescence quantum efficiency of $\eta_{int}^{Alq}$=0.32 for $Alq_3$ thin films (as reported by D. Z. Garbuzov et al., *Chem. Phys. Lett*, 249, 433 (1996)), and assuming an efficiency of $\eta_{int}^{DCM2}$=1.0 for DCM2, it is estimated that about 35% of the excitons recombine on $Alq_3$ molecules without transferring to DCM2, or equivalently $P_{H-G}$=65%, from which it can be inferred that $R_0$=16 Å. However, it is likely that $\eta_{int}^{DCM2}$ is less than unity since DCM2 molecules can interact with the $Alq_3$ host, resulting in non-radiative decay, in which case an even smaller fraction of excitons recombine on the $Alq_3$ molecules. For example, if it is assumed that $\eta_{int}^{DCM2}$=0.33, then $P_{H-G}$=85% and $R_0$=19 Å. This distance is within factor of two of $R_0$=39 Å calculated using the $Alq_3$ photoluminescent (PL) and DCM2 absorption spectral overlap in the Förster integral.

In considering the differences between these two estimates of $R_0$, it is noted that there are local variations in the distribution of DCM2 in $Alq_3$, as already inferred from analysis of the spectral shift. This inhomogeneity, however, is contrary to the assumptions used in Equation 2. To estimate the magnitude of the effects of these inhomogeneities, it is noted that, for a $Alq_3$:1% DCM2 OLED, the average separation between neighboring DCM2 monomers is about 5.3 $Alq_3$ molecules. With an $Alq_3$ molecular weight of 460 g/mol, and a thin film density of 1.3 g/cm$^3$ (as reported by H. Schmidbaur et al., *Z. Naturforsch*, B 46, 901 (1991)), the average spacing between $Alq_3$ molecules is about 9.4 Å, from which an average DCM2 spacing of $d_{DCM2}$=50 Å can be estimated. In fact, some pairs of DCM2 molecules will be farther apart than $d_{DCM2}$, and some will be closer together. The net effect results in a higher probability for recombination at an $Alq_3$ molecule prior to transfer. The net effect of the inhomogeneous dopant distribution is therefore to increase the host and decrease the dopant luminescence, or equivalently $P_{H-G}$ (homogeneous) >$P_{H-G}$ (inhomogeneous). The inhomogeneous distribution of distances between DCM2 molecules in a $Alq_3$:1% DCM2 OLED has been modeled as a Gaussian distribution centered at $d_{DCM2}$=50 Å, with a full-width at half-maximum of w. With $R_0$=39 Å, calculated via the Förster integral, and w=12 Å to 15 Å, $P_{H-G}$ is 85% to 75%, in agreement with PH- obtained from the EL spectral measurement. Local variations in the spacing between DCM2 dopant molecules may therefore account for the observed enhancement in $Alq_3$ luminescence.

In summary, it has been demonstrated that molecular polarization effects in small-molecular-weight organic thin films can significantly influence the emission spectra of the luminescent molecules. This effect was demonstrated by tuning the emission color of $Alq_3$:DCM2 OLEDs by varying the concentration of DCM2, shifting the peak of the EL spectrum by as much as 50 nm. The inventors' experimental results show that a $Alq_3$:1% DCM2 OLED has particularly high luminescence and external quantum efficiency when compared to known OLEDs that emit in the yellow to red region of the visible spectrum. However, luminescence and external quantum efficiency drop off at higher concentrations of DCM2.

The inventors analysis shows that it would be possible to shift the emission of an $Alq_3$:DCM2 OLED by doping the emissive layer with a polarization dopant molecule, such as yellow stilbene, that increases the local dipole moment without otherwise affecting the OLED properties. This polarization dopant molecule is preferably not emissive, and preferably does not accept excitons from the host material. Such a polarization dopant molecule can be used to red-shift the emission of the DCM2, without increasing the concentration of DCM2, thereby maintaining the high luminescence and external quantum efficiency of the $Alq_3$:1% DCM2 OLED. The inventors' analysis also shows that other emissive molecules, such as DCM1, may be used instead of DCM2.

The inventors' analysis also shows that mechanisms other than Förster transfer may be used to create excitons on emissive molecules present as a dopant in a host. For example, Dexter transfer, which involves the tunneling of an excited electron from a molecule of the host to a molecule of the dopant, and the simultaneous tunneling of a non-excited electron from the dopant to the host, may produce excitons on the dopant.

Another such mechanism is the trapping of charge carriers on molecules of the dopant. For example, the LUMO levels of the host and dopant may be arranged such that the LUMO level of the dopant is lower than the LUMO level of the host, such that the dopant molecule would act as an electron trap. Once an electron is trapped on a particular dopant molecule, a hole would eventually jump to that molecule, producing an exciton. Similarly, the HOMO levels of the host and dopant may be arranged such that the HOMO level of the dopant is higher than the HOMO level of the host, such that the dopant molecule would act as a hole trap. Once a hole is trapped on a particular dopant molecule, an electron would eventually jump to that molecule, producing an exciton.

In addition, one or more dopants, referred to herein as "transfer" dopants, may be used to facilitate the transfer of energy from the host to the emissive dopant. For example, cascade energy transfer may be used, Berggren, which involves the non-radiative transfer of excitons from a molecule of the host through one or more transfer dopants to the emissive dopant. These intermediate transfers may be by Förster transfer, Dexter transfer, hole trapping or electron trapping that eventually leads to the formation of an exciton on the transfer dopant or the emissive dopant, or any other suitable mechanism.

One problem that may occur, particularly if dopants are used in high concentrations, is the recrystallization of dopant molecules. This problem may be addressed by doping with one or more additional dopants, referred to herein as "stabilizing" dopants, that prevent such recrystallization.

The OLEDs of the present invention are comprised of a heterostructure for producing electroluminescence which may be fabricated as a single heterostructure or as a double heterostructure. As used herein, the term "heterostructure for producing electroluminescence" refers to a heterostructure that includes for a single heterostructure, for example, a substrate, a hole injecting anode layer in contact with the substrate, a HTL in contact with the anode layer, an ETL in contact with the HTL, and an electrode injecting cathode layer in contact with the ETL. If the cathode layer is a metal cathode layer of Mg:Ag, then a metal protective layer, for example, made of a layer of Ag for protecting the Mg:Ag cathode layer from atmospheric oxidation, may also be present.

The heterostructure for producing electroluminescence may also include a protection layer and/or an injection enhancement layer between the anode layer and the HTL or the cathode layer and the ETL. The protection layer serves to protect the underlying organic layers from damage during deposition of an ITO layer, for example. An injection enhancement layer serves to enhance injection of holes from the anode into the adjacent HTL, such as disclosed in copending Ser. No. 08/865,491, now U.S. Pat. No. 5,998, 803, for example, or to enhance injection of electrons from the cathode into the adjacent ETL, such as disclosed in copending application Ser. No. 08/964,863, and copending application entitled "Highly Transparent Non-Metallic Cathodes," Ser. No. 09/054,707 (filed Apr. 3, 1998), for example.

If a double heterostructure is used to produce electroluminescence, a separate emissive layer is included between the HTL and the ETL. The term "emissive layer" as used herein may refer either to the emissive electron transporting layer or emissive hole transporting layer of a single heterostructure or the separate emissive layer of a double heterostructure. The emissive layer of a double heterostructure is referred to as a "separate" emissive layer so as to distinguish it from the ETL of a single heterostructure, which may also be an emissive layer. The materials, methods and apparatus for preparing the organic thin films of a single or double heterostructure are disclosed, for example, in U.S. Pat. No. 5,554,220, which is incorporated herein in its entirety by reference.

Alternatively, the heterostructure for producing electroluminescence may have an inverted (IOLED) structure in which the sequence of layers deposited on the substrate is inverted, that is, an electron injecting cathode layer is in direct contact with the substrate, an electron transporting layer is in contact with the cathode layer, a hole transporting layer is in contact with the electron transporting layer, and a hole injecting anode layer is in contact with the hole transporting layer.

The heterostructure for producing electroluminescence may also include a hole blocking layer between the electron transporting layer and the hole transporting layer, for example, a hole blocking layer comprised of bathocouprine (BCP), which has the chemical structure:

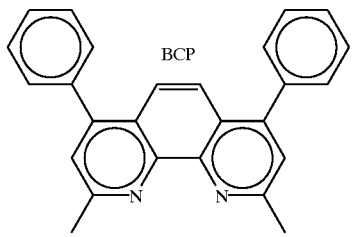

If the heterostructure for producing electroluminescence is included as part of a stacked OLED (SOLED), one or both of the electrodes of an individual heterostructure may be in contact with an electrode of an adjacent heterostructure. Alternatively, dependent on the circuitry used to drive the SOLED, an insulating layer may be provided between adjacent electrodes of two of the OLEDs in the stack.

The single or double heterostructures as referred to herein are intended solely as examples for showing how an OLED embodying the present invention may be fabricated without in any way intending the invention to be limited to the particular materials or sequence for making the layers shown. For example, a single heterostructure typically includes a substrate which may be opaque or transparent, rigid or flexible, and/or plastic, metal or glass; a first electrode, which is typically a high work function, hole-injecting anode layer, for example, an indium tin oxide (ITO) anode layer; a hole transporting layer; an electron transporting layer; and a second electrode layer, for example, a low work function, electron-injecting, metal cathode layer of a magnesium-silver alloy, (Mg:Ag) or of a lithium-aluminum alloy, (Li:Al).

Materials that may be used as the substrate in a representative embodiment of the present invention include, in particular, glass, transparent polymer such as polyester, sapphire or quartz, or substantially any other material that may be used as the substrate of an OLED.

Materials that may be used as the hole-injecting anode layer in a representative embodiment of the present invention include, in particular, ITO, Zn—I—$SnO_2$ or $SbO_2$, or substantially any other material that may be used as the hole-injecting anode layer of an OLED.

Materials that may be used in the HTh in a representative embodiment of the present invention include, in particular, N,N'-diphenyl-N,N'-bis(3-methylphenyl)1-1'biphenyl-4, 4'diamine (TPD), 4,4'-bis[N-(1-naphthyl)-N-phenyl-amino] biphenyl (α-NPD) or 4,4'-bis[N-(2-naphthyl)-N-phenyl-amino]biphenyl (P-NPD). Materials that may be used as the ETL include, in particular, aluminum tris(8-hydroxyquinolate) ($Alq_3$), a carbazole, an oxadiazole, a triazole, a thiophene or oligothiophene group. Other materials that may be used as the separate emissive layer, if present, include, in particular, dye-doped $Alq_3$, or substantially any other material that may be used as the separate emissive layer of an OLED.

Materials that may be used as the electron-injecting, metal cathode layer in a representative embodiment of the present invention include, in particular, Mg—Ag, Li—Ag or Ca, or a non-metallic material such as ITO, such as disclosed in copending Ser. No. 08/964,863, or substantially any other material that may be used as the cathode layer of an OLED.

The insulating layer, if present, may be comprised of an insulating material such as $SiO_2$, $SiN_x$ or $AlO_2$, or substantially any other material that may be used as the insulating material of an OLED, which may be deposited by a variety of processes such as plasma enhanced chemical vapor deposition (PECVD), electron beam, etc.

Certain embodiments of the OLEDs of the present invention have the advantage that they can be fabricated entirely from vacuum-deposited molecular organic materials as distinct, for example, from OLEDs in which some of the layers are comprised of polymeric materials, which cannot be readily deposited using vacuum deposition techniques. A vacuum-deposited material is one which can be deposited in a vacuum typically having a background pressure less than one atmosphere, preferably about $10^{-5}$ to about $10^{-11}$ torr for vacuum deposition, or about 50 torr to about $10^{-5}$ torr for vapor deposition.

Although not limited to the thickness ranges recited herein, the substrate may be as thin as 10 $\mu$, if present as a flexible plastic or metal foil substrate, such as aluminum foil, or substantially thicker if present as a rigid, transparent or opaque, substrate or if the substrate is comprised of a silicon-based display driver; the ITO anode layer may be from about 500 Å (1 Å=$10^{-8}$ cm) to greater than about 4000 Å thick; the hole transporting layer from about 50 Å to greater than about 1000 Å thick; the separate emissive layer of a double heterostructure, if present, from about 50 Å to about 200 Å thick; the electron transporting layer from about 50 Å to about 1000 Å thick; and the metal cathode layer from about 50 Å to greater than about 1000 Å thick, or substantially thicker if the cathode layer includes a protective silver layer and is opaque.

Thus, while there may be substantial variation in the type, number, thickness and order of the layers that are present, dependent on whether the device includes a single heterostructure or a double heterostructure, whether the device is a SOLED or a single OLED, whether the device is a TOLED or an IOLED, whether the OLED is intended to produce emission in a preferred spectral region, or whether still other design variations are used, the present invention is directed to those devices in which the wavelength of the emission has been controlled using the local dipole moment of the emissive layer.

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

Experiments

Group I

The inventors have demonstrated red, orange, and yellow OLEDs having an emissive layer comprising $Alq_3$ doped with DCM2. The color of the emission was controlled by varying the concentration of DCM2.

Double heterostructure OLEDs, as shown in FIG. 1, were fabricated. OLED 100 has an anode 120, a hole transporting layer 130, a separate emissive layer 140, an electron transporting layer 150, a cathode 160, and a cap 170, sequentially layered on a substrate 110. Substrate 110 and anode 120 were made of precleaned, indium-tin-oxide (ITO) coated glass, where substrate 110 is glass and anode 120 is ITO. Hole transporting layer 130, sepaate emissive layer 140, electron transporting layer 150, cathode 160, and cap 170 were grown, in that order, in a high vacuum ($10^{-4}$ Torr) by thermal evaporation, at deposition rates that ranged from about 1 to 5 Å/s. Hole transporting layer 130 is a 300 Å thick layer of 4,4'-bis[-(1-naphthyl)-N-phenyl-amino] biphenyl (α-NPD), separate emissive layer 140 is a 300 Å thick layer of $Alq_3$ doped with from 1% to 10% by mass of DCM2, electron transporting layer 150 is a 100 Å thick layer of $Alq_3$, cathode 160 is a 500 Å thick layer of 25:1 Mg:Ag alloy, and cap 170 is a 1000 Å thick layer of Ag. Cathode 160 and cap 170 were deposited through a shadow mask to define 1 mm diameter circular cathodes 160 and caps 170. OLEDs were fabricated having a separate emissive layer 140 that is $Alq_3$:1% DCM2 (Q=0.01), $Alq_3$:2% DCM2 (Q=0.02), $Alq_3$:5% DCM2 (Q=0.05), and $Alq_3$:10% DCM2 (Q=0.10).

Figure 2:
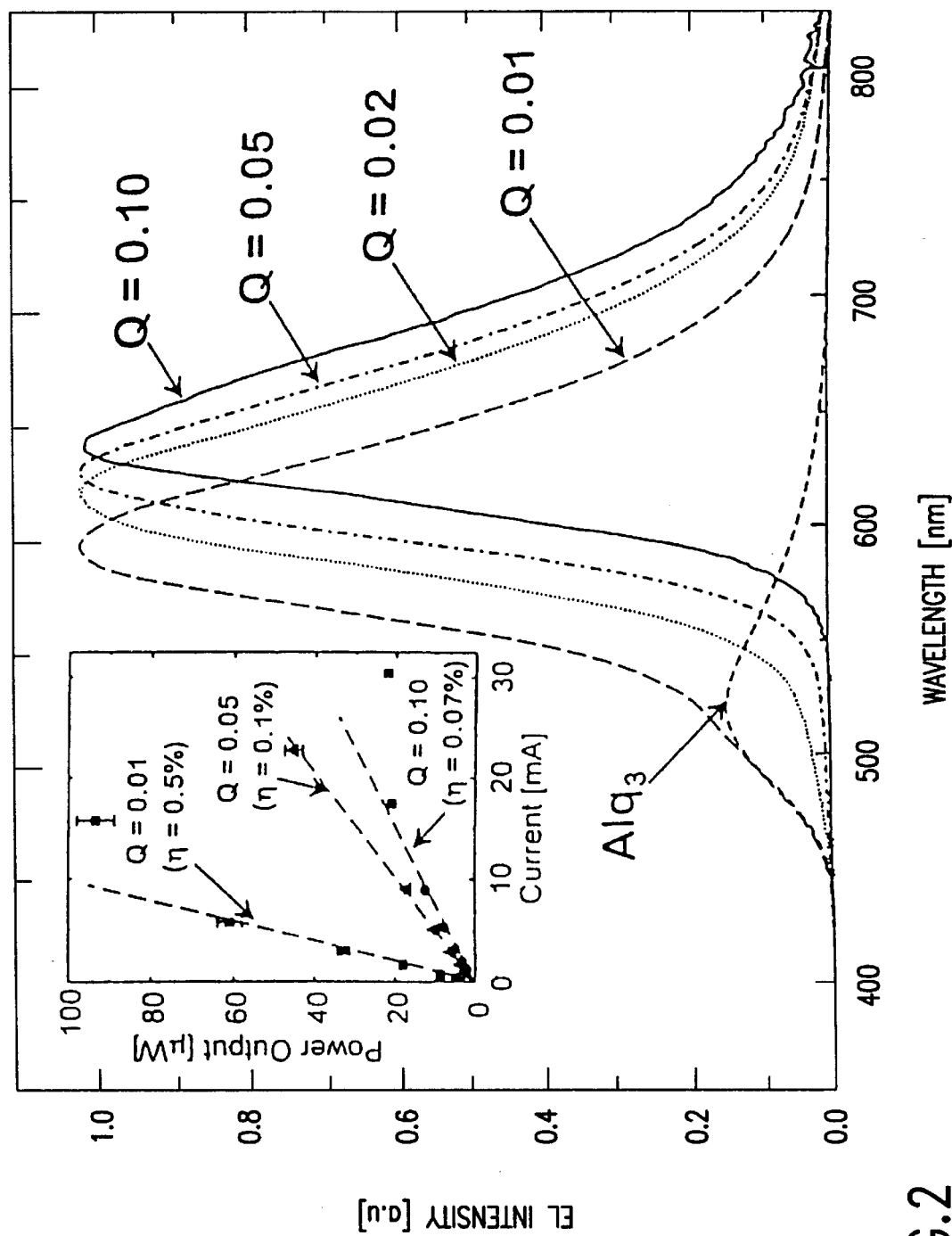
FIG. 2 shows electroluminescent (EL) spectra for the OLEDs of FIG. 1, having an $Alq_3$:DCM2 separate emissive layer, for various concentrations of DCM2. The inset shows plots of power output v. current for the OLEDs.

As shown in FIG. 2, the concentration of DCM2 in separate emissive layer 140 strongly influenced the OLED electroluminescence (EL) spectrum and efficiency. As the DCM2 concentration in $Alq_3$ was increased from 1% to 10% (represented by Q increasing from 0.01 to 0.10 in FIG. 2), the output spectrum of OLEDs 100 was red shifted by 50 nm, with a relatively unchanged peak width. This shift is accompanied by a concomitant decrease in the external EL quantum efficiency from $\eta=0.5\%$ to $\eta=0.07\%$, as shown in the plots of output optical power vs. input current (L-I) in the inset of FIG. 2. The pronounced red shift on increasing DCM2 concentration can be understood by examining FIG. 3 and Table 2. FIG. 2 also shows the contribution of emission from $Alq_3$ to the emission of the $Alq_3$:1% DCM2 OLED.

Figure 3:
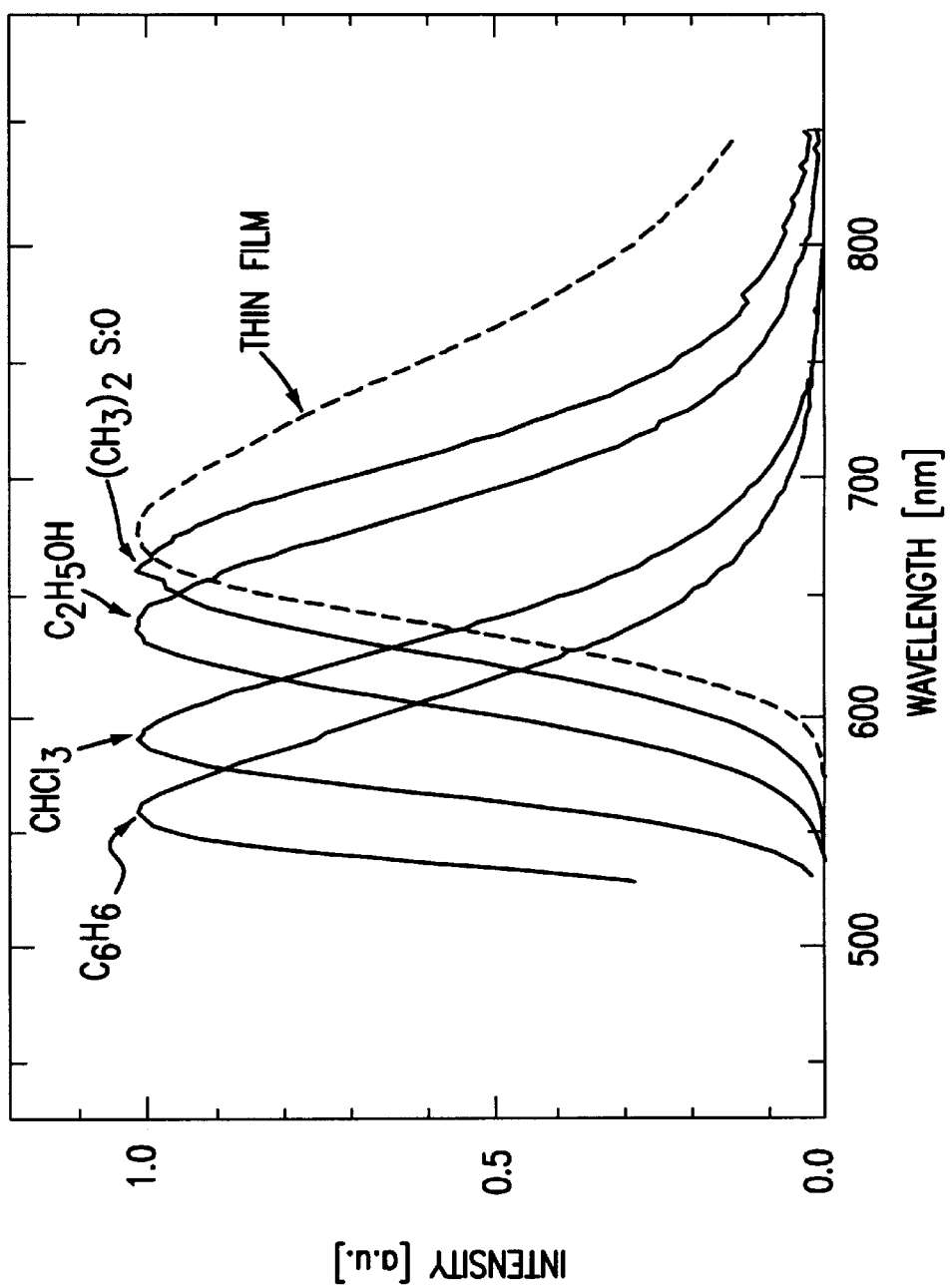
FIG. 3 shows photoluminescent (PL) spectra for DCM2 in various polar and non-polar solvents, as well as a PL spectra for a neat thin film of DCM2.

FIG. 3 shows normalized photoluminescence (PL) spectra for DCM2 in a variety of solutions, as well as the PL spectrum of a neat thin film of DCM2. The solutions are very dilute solutions of DCM2 (~1/1000 of the saturated solution concentration) in various polar and non-polar solvents, including benzene ($C_6H_6$), chloroform ($CHCl_3$), ethanol ($C_2H_5OH$), and DMSO (($CH_3$)$_2$S:O). Such dilute solutions ensure that the spectra observed are due to monomer fluorescence, and that the contribution from aggregate luminescence is negligible. The solutions were optically excited using a multi-wavelength Ar ion laser, having λ (wavelength) between about 460 nm and 514 nm, and the PL emissions were measured to give the results shown in FIG. 3. There was no significant difference in the quantum yield of any of the solutions.

Table 1 shows the dipole moment $\mu$ and the dielectric constant $\epsilon$ for various liquid and thin film solutions, and the peak emission wavelength $\lambda_{max}$ of DCM2 in these solutions:

TABLE 1

| Material | $\mu$ (debyes) | $\epsilon$ | $\lambda_{max}$ (nm) |
|---|---|---|---|
| LIQUIDS | | | |
| Benzene ($C_6H_6$) | 0 | 2.27 | 565 |
| Chloroform ($CHCl_3$) | 1.15 | 4.81 | 595 |
| ethanol ($C_2H_5OH$) | 1.69 | 24.3 | 645 |
| DMSO ($CH_3$)$_2$S:O | 3.9 | 46.7 | 675 |
| THIN FILMS | | | |
| $Alq_3$ | 5.5 | 2.96 | 520 |
| $Alq_3$:1% DCM2 | 5.56 | 2.97 | 600 |
| $Alq_3$:2% DCM2 | 5.61 | 2.98 | 625 |
| $Alq_3$:5% DCM2 | 5.78 | 3.01 | 640 |
| $Alq_3$:10% DCM2 | 6.0 | 3.06 | 650 |
| DCM2 | 11.3 | 4.0 | 685 |

Values for $\mu$ and $\epsilon$ for the solvents are from "Solvent Guide," J. T. Przybytek, Ed., Jackson Laboratories, 2nd Ed. (1982) and "Handbook of Chemistry and Physics," R. C. Weast, Ed., 56th Ed., CRC Press (1976). For $Alq_3$ and DCM2, semi-empirical molecular orbital calculations based on an intermediate neglect of differential overlap algorithm, parametrized from solution electronic spectra for the optimized molecular geometries, were used to obtain $\mu$. For $Alq_3$ and DCM2, $\epsilon$ was as inferred from the refractive index of DCM2, measured ellipsometrically. For $Alq_3$:DCM2 thin film solutions, $\mu$ and $\epsilon$ were calculated by linear extrapolation from the values for the constituent compounds.

Table 1 shows a high correlation between the dipole moment of the solution and the peak emission wavelength $\lambda_{max}$ of DCM2, where $\lambda_{max}$ is red shifted for solutions having a higher dipole moment. For DCM2 in liquid solutions, $\lambda_{max}$ varies from 565 nm for the nonpolar solvent, benzene, with a dielectric constant of $\epsilon=2.27$, to 675 nm for dimethylsufoxide (DMSO) with a dipole moment of 3.9 D and $\epsilon=46.7$. For DCM2 in thin film solutions with $Alq_3$, $\lambda_{max}$ varies from 600 nm for $Alq_3$:1% DCM2 to 650 nm for $Alq_3$:10% DCM2. Indeed, the PL of the neat DCM2 thin film is shifted to $\lambda_{max}=685$ nm, a shift of 120 nm from DCM2 in a non-polar solvent.

The broad emission spectrum of the OLEDs yields a saturated color that is dependent on the concentration of DCM2 in $Alq_3$, and has an external quantum efficiency of as high as 0.5%. A shift of 50 nm in the peak emission wavelength of the OLEDs was observed as DCM2 concentration was increased from 1% to 10%. For red and yellow-orange OLEDs, a maximum luminance of 1400 cd/m$^2$ and 15200 cd/r$^2$ is measured, respectively. The current vs. voltage dependencies of these devices are consistent with trap-limited conduction, unaffected by the presence of DCM2. A luminance of 100 cd/m² is attained at 100 mA/cm² and 14 V for the red Alq₃:10% DCM2 OLED, whereas the same luminance intensity is attained at 10 mA/cm² and 12 V for the yellow-orange Alq₃:1% DCM2 OLED. The ten times higher current of the red OLED is due to the lower quantum efficiency of these OLEDs, as well as to the lower photopic response of the human eye to red as compared to yellow light.

The similarity of the spectral widths, and the magnitudes of the peak shifts in FIGS. 2 and 3, suggests that DCM2 suspended in a solid matrix of Alq₃ undergoes an energy shift due to self-polarization. That is, as the DCM2 concentration in the relatively non-polar Alq₃ is increased, the distance between nearest neighbor, highly polar, DCM2 molecules decreases, thereby increasing the local polarization field, which tends to red-shift the DCM2 emission spectrum. The effect is increased until the DCM2 concentration is 100% in an undiluted DCM2 film, where $\lambda_{max}$ is close to that attained for DCM2 in the polar solvent, DMSO. By comparison, the most dilute solution of 1% DCM2 in Alq₃ has $\lambda_{max}$=600 nm, which is similar to that for DCM2 in CHCl₃, which has a dipole moment of 1.15 D (and ε=4.81). This suggests that even at concentrations as low as 1%, the emission of DCM2 in a Alq₃:DCM2 OLED is influenced by the presence of other DCM2 molecules, given that a smaller shift than that observed would be expected from interactions only with the less polar Alq₃.

Figure 4:
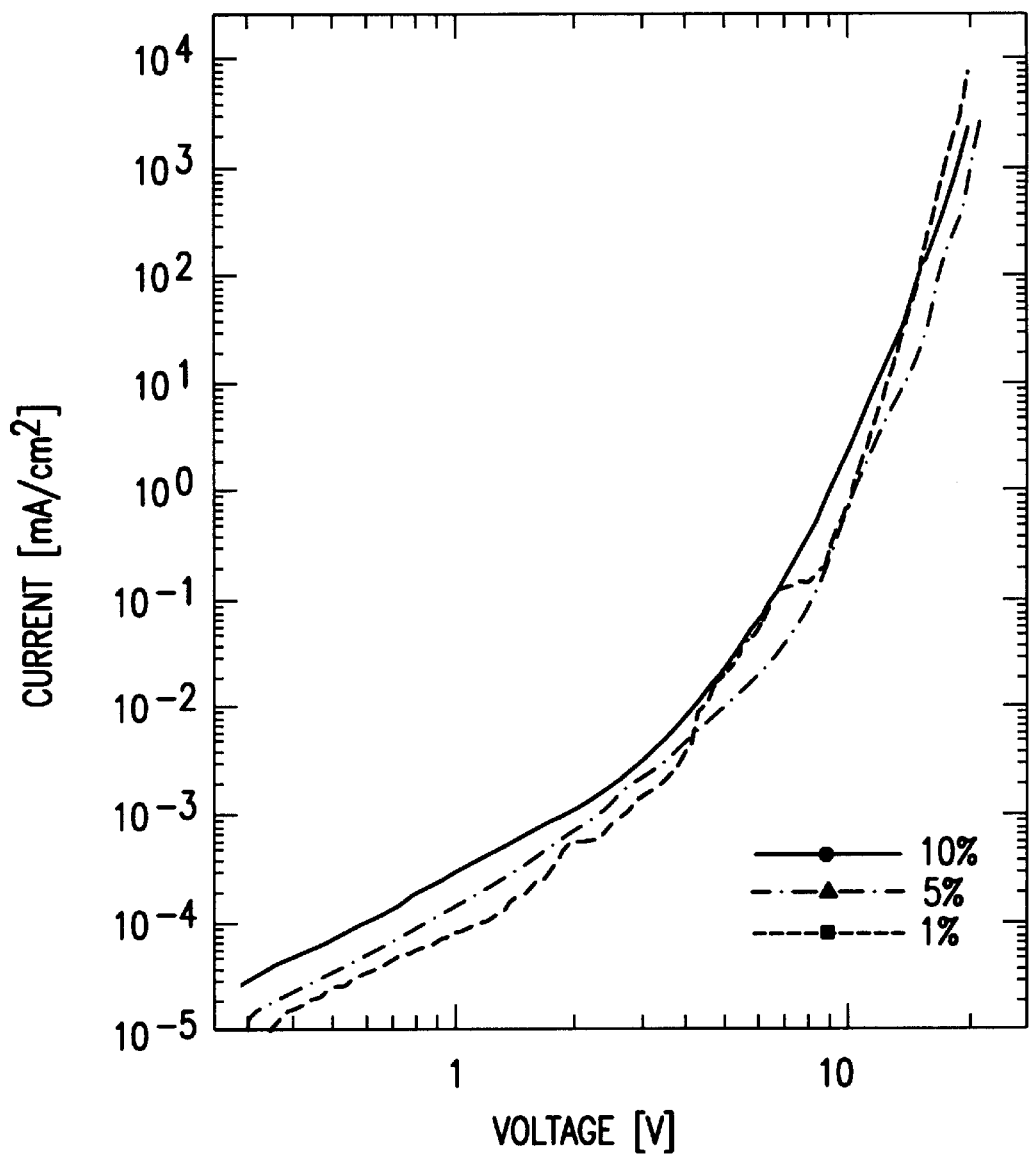
FIG. 4 shows current v. voltage (I–V) plots for OLEDs having an $Alq_3$:DCM2 separate emissive layer, for various concentrations of DCM2.

FIG. 4 shows forward biased current-voltage (I–V) characteristics of Alq₃:DCM2 OLEDs. These I-V characteristics are similar to those previously reported for other OLEDs, where trap-limited conduction (I $V^{m+1}$) is observed. See P. E. Burrows et al., J. Applied Physics 79, 7991 (1996). For Alq₃:DCM2, an m of 11±1 is observed at high applied voltage, independent of the concentration of DCM2. At lower voltages, an m of about 2 is observed, characteristic of space-charge limited transport. Concentrations of DCM2 in Alq₃ do not therefore significantly influence the Alq₃ trap distribution. As previously concluded, FIG. 4 shows that the I-V characteristics of Alq₃:DCM2 OLEDs are primarily limited by bulk currents in the Alq₃, at least for DCM2 concentrations of up to 10%.

Figure 5:
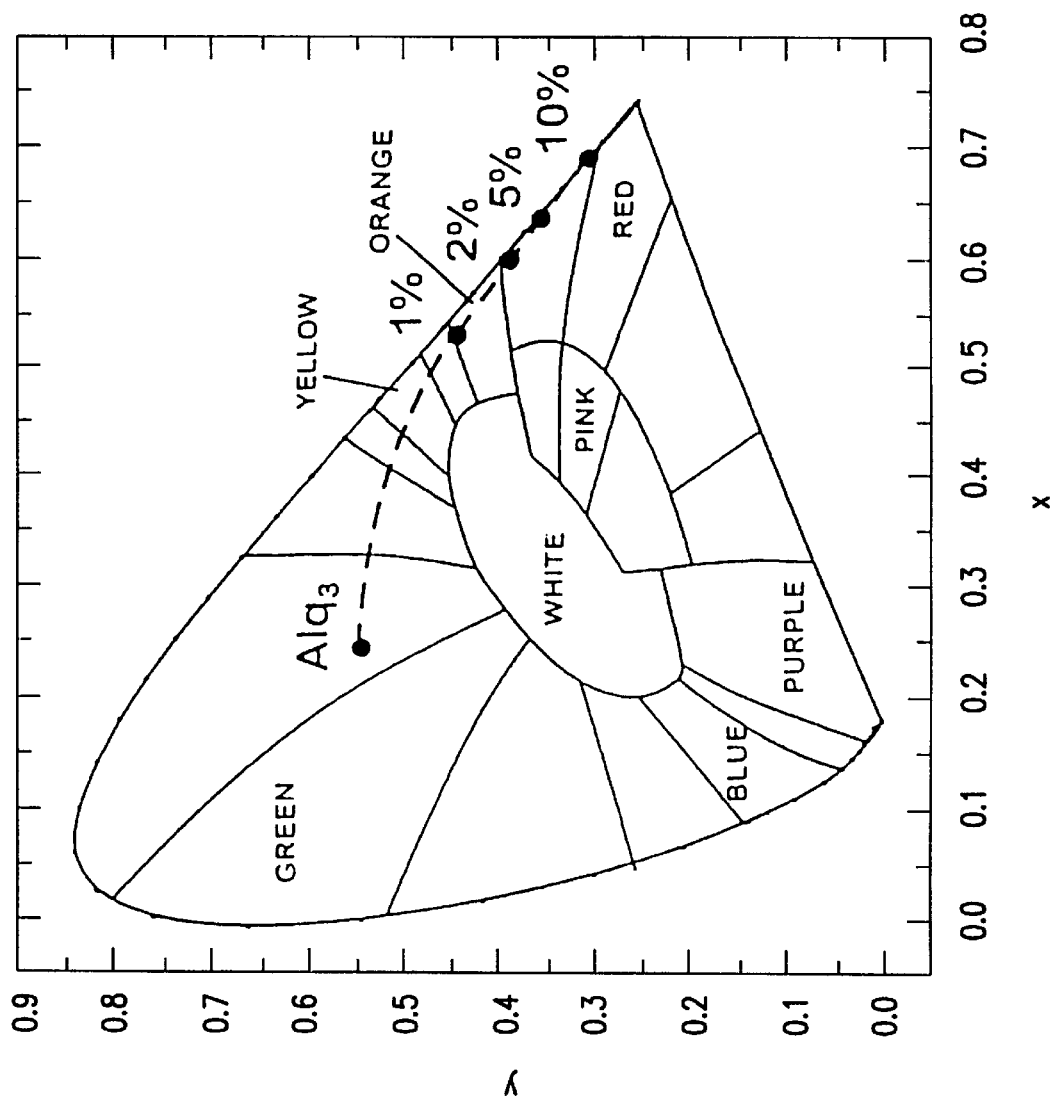
FIG. 5 shows the color of emission of the OLEDs, plotted on a CIE chromaticity diagram.

FIG. 5 shows the chromaticity coordinates of Q=0.01, 0.02, 0.05, and 0.10 DCM2:Alq₃ OLEDs, as well as an undoped α-NPD/Alq₃ device. Saturated red emission is observed for an Alq₃:10% DCM2 OLED, and yellow-orange emission for the Alq₃:1% DCM2 OLED. At concentrations of DCM2 lower than 1%, yellow and yellow-green EL emission should also be achievable.

Table 2 shows the electroluminescence characteristics of selected OLEDs with emission between red and yellow, including maximum reported luminance under DC bias ($L_{MAX}$), current and voltage at $L_{MAX}$, external quantum efficiency of photons per electron (η), CIE coordinates, and perceived color.

TABLE 2

| Material/Method | $L_{MAX}$ [cd/m²] | (I, V) [mA/cm², V] @ $L_{MAX}$ | η [%] | CIE (x,y) - color | Ref. |
|---|---|---|---|---|---|
| Alq₃:10% DCM2 | 1400 | (2200, 19) | 0.07 | (0.64, 0.36)- red | THIS WORK |
| Alq₃:1% DCM2 | 15200 | (2000, 17) | 0.5 | (0.54, 0.44)- yellow | |
| Eu(DBM)₃(phen) in PBD | 460 | (300, 16) | — | (0.68, 0.32)- red | [1] |
| Bu(TTA)₃ (phen) in 1AZM-Hex (Q = 0.05) | 137 | (200, —) | 0.03 | (0.68, 0.32)- red | [2] |
| Luminescent Blue PL Conversion & Filtering | 120 | (20, 10) | — | (0.65, 0.32)- red | [3] |
| TPP in Alq₃ (Q = 0.03) | 60 | (45, 35) | 0.11 | (0.68, 0.32)- red | [4] |
| Eu (TTA)₃(phen) | 30 | (100, 16) | — | (0.68, 0.32)- red | [5] |
| Eu (ttfa)₃ in PMPS | 0.3 | (22, 18) | 0.001 | (0.69, 0.13)- red | [6] |
| DCM1 in Alq₃ (Q = 0.10) | 150 | (—, 10) | — | (0.62, 0.36)- red | [7] |
| DCM1 in Alq₃ (Q = 0.0025) | — | (65, —) | 2.3 | (0.57, 0.43)- orange | [8] |
| DCM1 in Alq₃ | — | (—, —) | 0.03 | (0.57, 0.43)- orange | [9] |

The Alq₃:DCM2 OLED data of Table 2 is from the inventor's own work, while the other data is from the literature. The data from the literature falls into two categories: OLEDs with a guest:host EL layer: [1] J. Kido et al., Appl. Phys. Lett., 65, 2124 (1994); [2] T. Sano et al., Japan J. Appl. Phys., 34, 1883 (1995); [4] Z. Shen et al., Science, 276, 2009 (1997); [5] T. Tsutsui et al., Appl. Phys. Lett, 65, 1868 (1994); [6] J. Kido et al., J. Alloys and Compounds, 192, 30 (1993); [7] Y. Kijima et al., IEEE Transactions on Electron Devices, 44, 1222 (1997); [8] C. W. Tang et al., J. Appl. Phys., 65, 3610 (1989); [9] J. Littman et al., J. Appl. Phys., 72, 1957 (1992); and structures filtered by microcavity band-pass filters: [3], S. Tasch et al., Adv. Mater., 9, 33 (1997). The chemical names and/or structures of the molecules referred to in the table can be determined from these cited references, which are incorporated herein by reference. For OLEDs exhibiting saturated red emission, DCM2-doped Alq₃ devices have the highest maximum brightness and an external quantum efficiency comparable to the highest efficiencies reported elsewhere. The high luminescence and external quantum efficiency of the Alq₃:DCM2 OLEDs, particularly for Alq₃:1% DCM2, indicates that Alq₃:DCM2 OLEDs have significant potential.

Group 2

Figure 6:
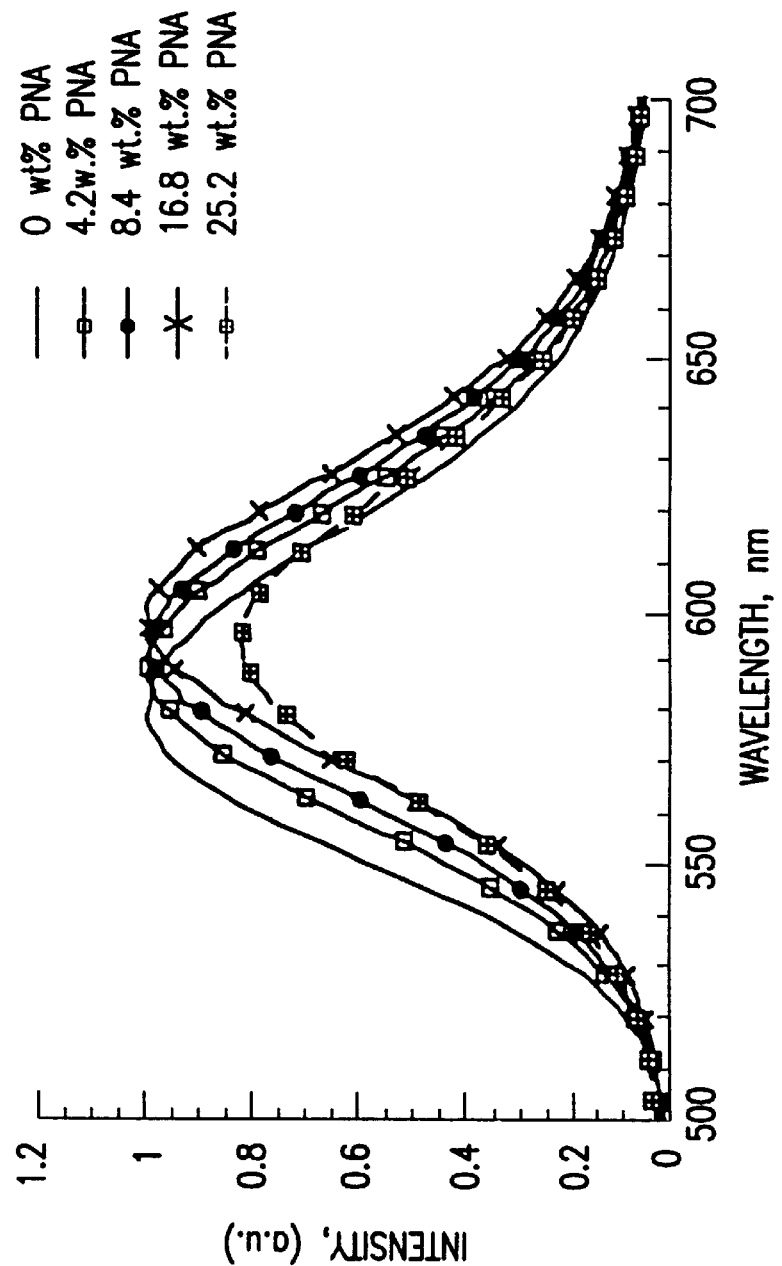
FIG. 6 shows emission spectra of DCM2 doped into polystyrene with varying amounts of N,N-dimethylparanitroaniline added.
Figure 7:
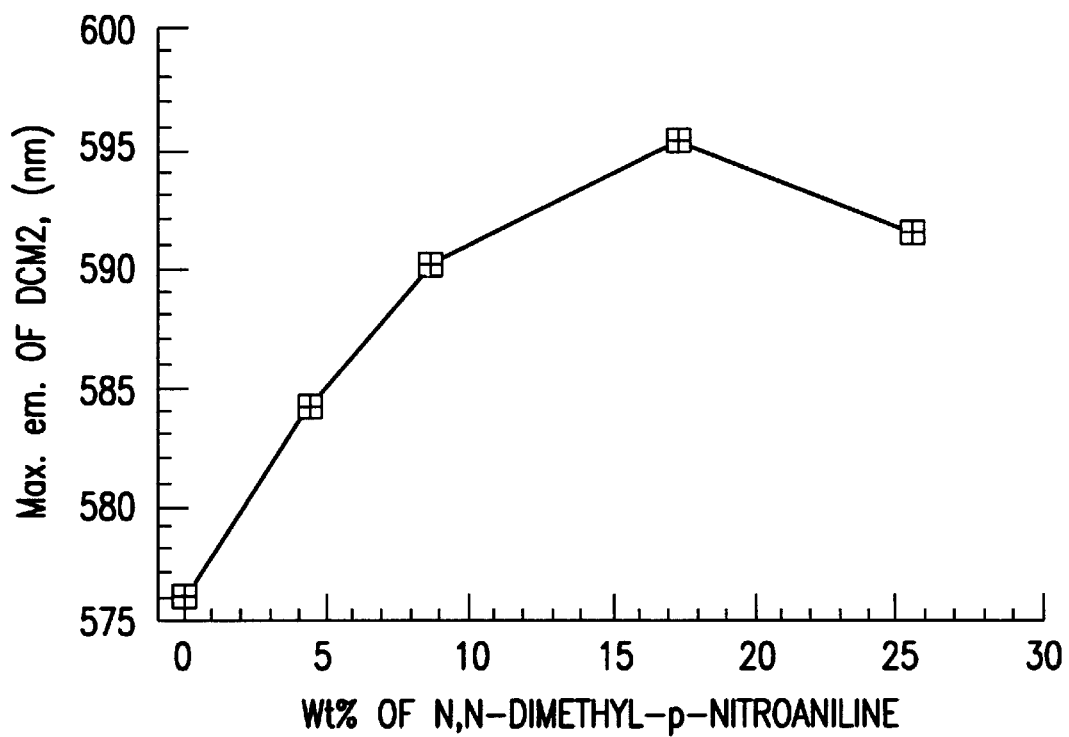
FIG. 7 shows the dependence of luminescence of $\lambda$max on percentage of N,N-dimethylparanitroaniline in the polystyrene.
Figure 8:
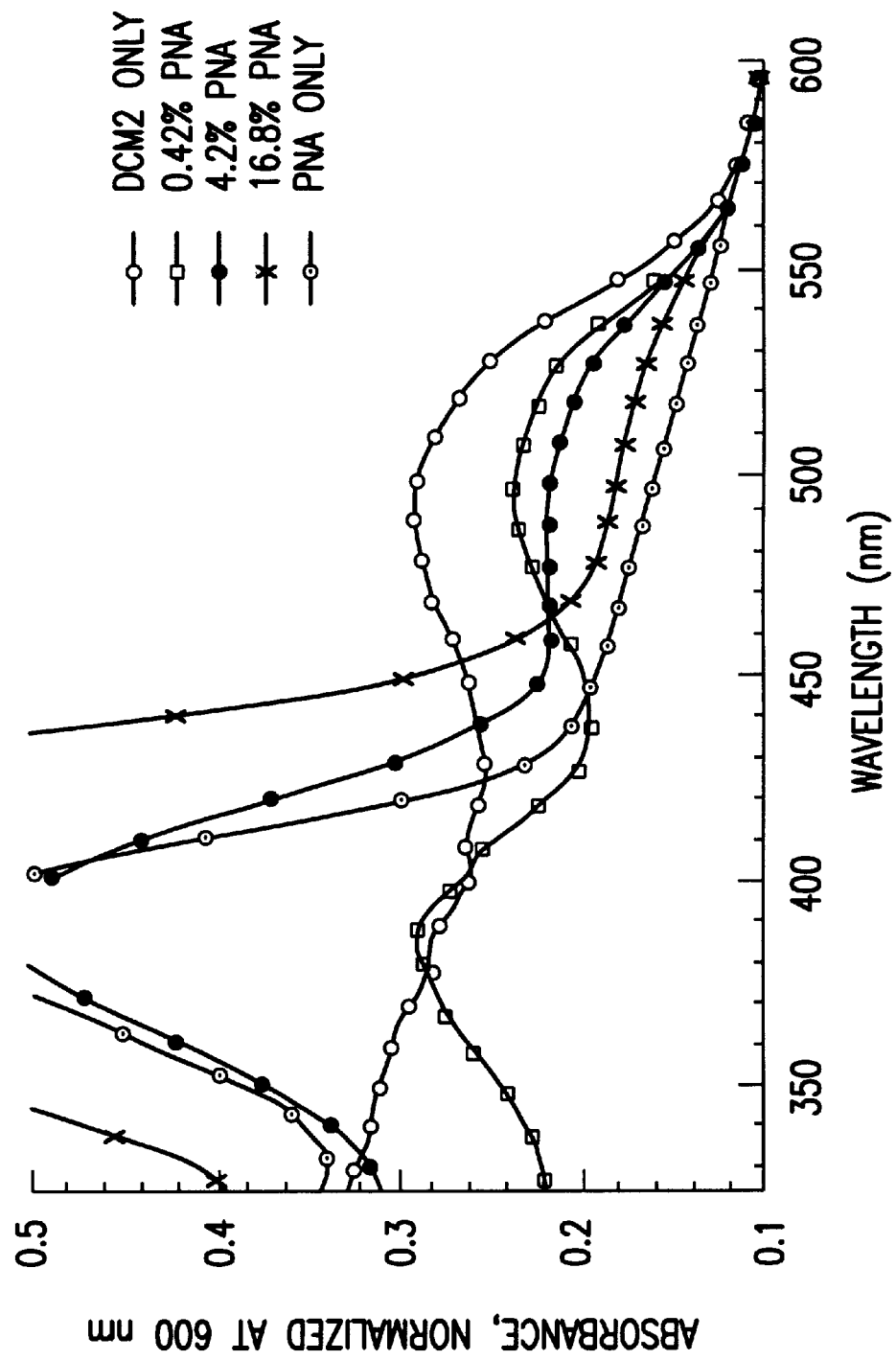
FIG. 8 shows the absorption spectra of doped polystyrene thin films.

There are other polarization dopant molecules which can be used to shift electroluminescence. This approach for an OLED involves an emissive layer with three different components. For example, in a simple two layer OLED, consisting of tertiary amine HTL and aluminum tris(8-hydroxyquinolate) ("Alq$_3$") ETL layers, the ETL layer would be composed of three materials. In addition to Alq$_3$, the ETL will have a dye dopant and a polarization dopant. The polarization dopant acts to shift the emission spectrum of the dye by changing the polarity of the medium. This shifting effect can be observed in the photoluminescence spectra. For the experiment depicted in FIGS. 6 through 8, DCM2 was loaded into polystyrene at 0.4 weight %. This DCM2 doped polystyrene was then doped with varying amounts of N,N-dimethylparanitronaniline (PNA), which PNA serves as a polarization dopant molecule. The dipole moment of PNA is 6.5 D. As the amount of PNA in the polystyrene in the polystyrene/DCM2 mixture is increased, the photoluminescence spectrum of the DCM2 gradually red shifts. This shift can be seen in the spectra of FIG. 6 and in the graph of FIG. 7. The wavelength of excitation energy was chosen to be low enough that the PNA is not absorbing (i.e., 500 nm, see FIG. 8). The quantum yield for emission from these films is not significantly affected by doping. A similar effect is observed when DCM2 is dissolved in a range of different solvents (see FIG. 3). The more polar the solvent is the more red shifted the emission spectrum is.

The mechanism of PNA induced shifts is believed to be the same as described above, in Group I. The PNA gradually changes the polarity of the medium, thereby red shifting emission. The highest PNA doping level does not appear to make sense with the red shift being directly related to the doping level of PNA (i.e., 16.8% PNA is to the red of 25% PNA). The reason for this anomalous result is that PNA crystallizes at the higher doping level, giving relatively less PNA dissolved in polystyrene.

Not all dyes will red shift on increasing the polarity of the medium. Some dyes blue shift and some dyes do not shift at all (see: J. A. Barltrop and J. D. Coyle, Principles of Photochemistry, John Wiley & Sons, New York, 1978). The materials that give the largest shifts are dyes whose emission comes from a charge transfer transition. This charge transfer will give the excited state a very different dipole moment than that of the ground state. The more polar state (ground or excited) will be stabilized in polar solvents and destabilized in nonpolar solvents, leading to a solvent dependent highest-occupied molecular orbital-lowest unoccupied molecular orbital gap ("HOMO-LUMO gap"). There will thus be a solvent dependent emission energy. Centrosymmetric dyes, such as fused polycyclic aromatic compounds, will show relatively little solvent dependence and will not be significantly affected by solvent or polarity changes induced by adding dopants like PNA.

Embodiments of the shifting mechanism for tuning color in OLEDs involve doping one of the transport layers with a luminescent dye at a fairly low level (typically 0.5% to 3% by weight for fluorescent and 1% to 10% for phosphorescent dyes). The polarization dopant molecule is added at a level to produce the correct emission spectrum. The choice of the polarization dopant molecule is made according to several criteria. The polarization dopant molecule should have a high dipole moment; have all of its absorption bands situated so that they do no overlap with the emission lines of either the luminescent dopant or the transport material (for those cases whenever the polarization dopant does not also function as an energy transfer dopant such as in the Group 3 experiments below); should be stable against crystallization in the film; must not form an exciplex with either the luminescent dye or the transport material; and must not be a carrier trap in the transporting material. For vacuum deposited devices the polarization dopant molecule must be stable to sublimation. Illustrative polarization dopant molecules are shown below:

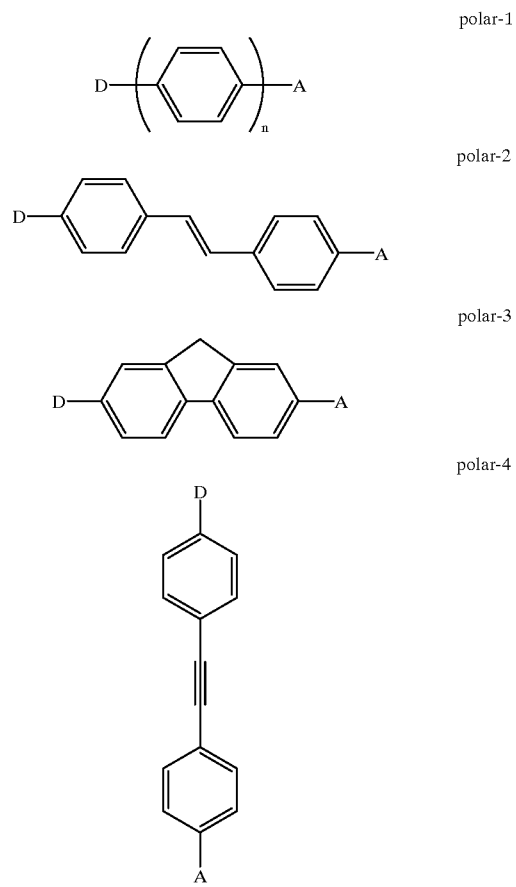

Herein, D stands for an electron donor (which donates electron density to the aromatic system) and A stands for an electron acceptor (which accepts electron density from the aromatic system). Specific examples are given in Table 3 wherein D, A, and n are defined Table 3.

TABLE 3

| type | D | A | n | $\mu$(D) | $\lambda_{max}$ (nm) | reference |
|---|---|---|---|---|---|---|
| polar-1 | (CH$_3$)$_2$N | CN | 1 | 5.6 | 290 | a |
| polar-1 | (CH$_3$)$_2$N | NO$_2$ | 1 | 6.4 | 376 | a |
| polar-1 | (CH$_3$)$_2$N | CHO | 1 | 5.1 | 326 | a |
| polar-1 | (CH$_3$)$_2$N | COCF$_3$ | 1 | 5.9 | 356 | a |
| polar-1 | CH$_3$O | CN | 1 | 4.8 | 248 | a |
| polar-1 | CH$_3$O | NO$_2$ | 1 | 4.6 | 303 | a |
| polar-2 | (CH$_3$)$_2$N | CN | — | 5.7 | 382 | a |
| polar-2 | (CH$_3$)$_2$N | NO$_2$ | — | 6.6 | 427 | a |
| polar-2 | CH$_3$O | CN | — | 3.8 | 340 | a |
| polar-2 | CH$_3$O | SO$_2$C$_6$F$_{13}$ | — | 7.8 | 347 | a |
| polar-2 | CH$_3$O | NO$_2$ | — | 4.5 | 364 | a |
| polar-3 | CH$_3$O | NO$_2$ | — | 4.7 | 356 | b |
| polar-3 | (CH$_3$)$_2$N | NO$_2$ | — | 6.0 | 417 | b |
| polar-3 | H | CN | — | 3.9 | 284 | b |
| polar-4 | (CH$_3$)$_2$N | CN | — | 6.1 | 372 | b |
| polar-4 | CH$_3$S | CN | — | 4.0 | 333 | b |
| polar-4 | CH$_3$O | NO$_2$ | — | 4.4 | 356 | b |

TABLE 3-continued

| type | D | A | n | μ(D) | λ_max (nm) | reference |
|---|---|---|---|---|---|---|
| polar-4 | $CH_3S$ | $NO_2$ | — | 4.0 | 362 | b |
| polar-4 | $(CH_3)_2N$ | $NO_2$ | — | 6.1 | 415 | b |

Reference a is L. T. Cheng, W. Tam, S. H. Stevenson, G. R. Meredith, G. Rikken, S. R. Marder, Journal of Physical Chemistry, 1991, 95, 10631–10643. Reference b is L. T. Cheng, T. Tam, S. R. Marder, A. E. Steigman, G. Rikken, C. W. Spangler, Journal of Physical Chemistry, 1991,95, 10643–10652.

Disubstituted benzenes (polar-1, n=1) have relatively high dipole moments and are typically transparent to visible light. Substituted stilbenes (polar-2) also have high dipole moments, but the increase conjugation length makes them absorbing in the visible spectrum.

One host material used in OLEDs is $Alq_3$. This material has a dipole moment of approximately 5 D (estimated from semiempirical theoretical calculations). In order for a polar dopant to affect the polarity of the medium it must have a volume dipole moment larger than $Alq_3$. PNA has a dipole moment of 6.4 D, which is only slightly larger than that of $Alq_3$. The volume of PNA is roughly ¼ of that of $Alq_3$, so that doping of PNA, or of other small molecules with reasonable dipole moments, will increase the polarity of the matrix. The effect of polar molecule doping would be enhanced at low doping levels if the matrix itself were nonpolar. The advantage of low doping is that there is less of a chance that the doping will decrease the carrier conduction in the matrix material and there will be less of a chance that the dopant will crystallize. Two examples of nonpolar matrix materials that make suitable electron transporters are $Mq_4$ and $Mq_2R_2$, shown below.

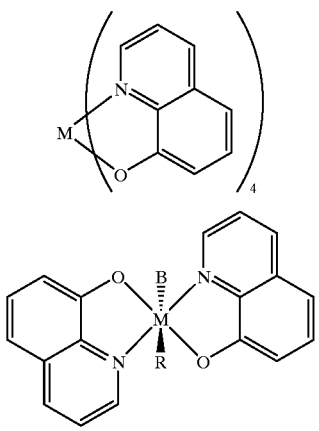

$Mq_4$, M=group 4 or 14 metal $Mq_2R_2$, M=group 4 or 14 metal

R=alkyl, aryl, alkoxy, halide, pseudohalide,

B=alkyl, aryl, alkoxy, halide, pseudohalide,

Pseudohalides have chemistry similar to that of halides and include —CN and —CNS. $Mq_4$ exists as several structural isomers. They all have approximately cubic coordination about the central metal atom, but have different dispositions of the four quinolates. Two of the nonpolar (centrosymmetric) structures are shown:

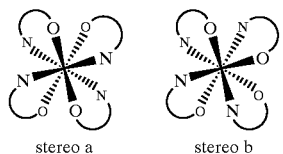

stereo a     stereo b

In order to favor these isomers, it may be important to increase the steric bulk at the 2 position of the quinolate or prepare the quinolates as pairs with bridges between the "2 positions" of the quinolates.

One member of the $Mq_4$ class, $Zrq_4$, has been structurally characterized in D. F. Lewis, R. C. Fay, Chem. Soc. Chem. Commun., 1046–1047 (1974). The structure of this material is similar to that pictured in stereo a, which is the preferred structure for forming a nonpolar molecule. The factors that control which isomer is formed are related to both steric and electronic effects. We have prepared quinaldine complexes in which the 2-carbon (adjacent to the nitrogen) is substituted with methyl. The complex is depicted in the following.

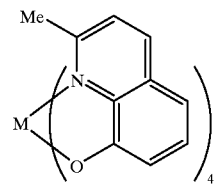

$Mq'_4$, M=group 4 or 14 metal

Figure 9:
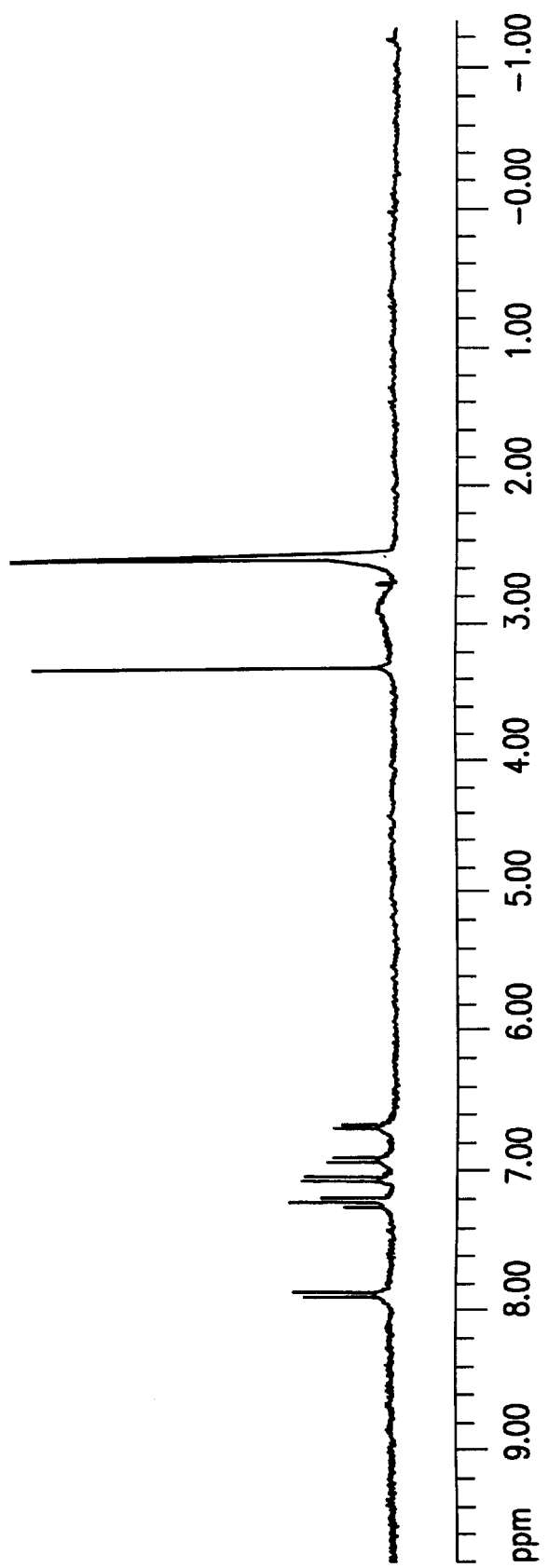
FIG. 9 is a proton NMR spectrum of a Zr-quinaldine complex.
Figure 10:
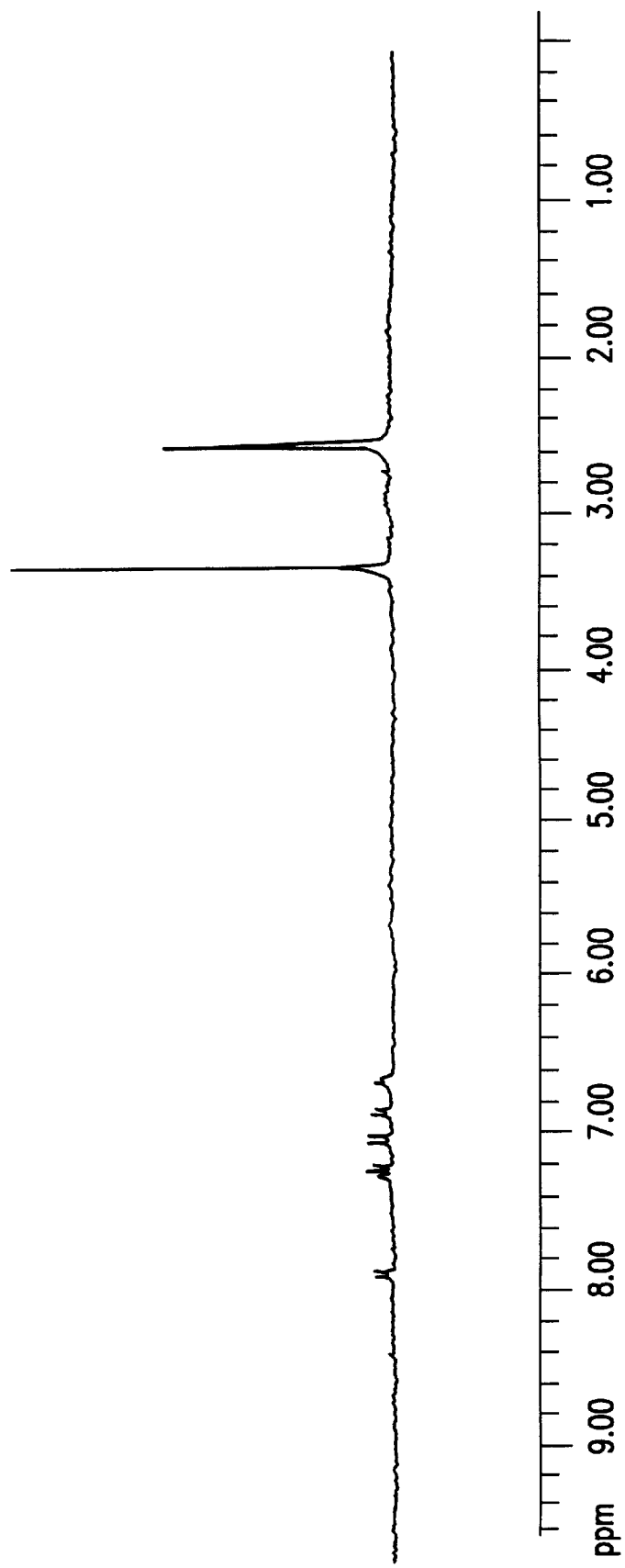
FIG. 10 is a proton NMR spectrum of a Hf-quinaldine complex.

The compounds with the methyl group increase the steric congestion and favor the stereo a isomer. Nuclear magnetic resonance (NMR) spectra of the Zr and Hf complexes in solution are shown in FIGS. 9 and 10. The spectra show four well resolved peaks for the four hydrogens bound to the aromatic system and a single peak for the methyl group. This simple coupling pattern would not be expected for asymmetric isomers (which can be more complicated; see H. Schmidbauer, J. Lettenbauer, D. L. Wilkinson, G. Mueller, O. Kumberger, Z. Naturforschung, 1991, 46B, 901), but is exactly what is expected for either stereo a or stereo b. Alternately, these isomers could be isomerizing in fluid solution so that only the averaged signals are observed. However, this isomerization is doubtful considering similar processes are not observed for group 3 and 13 triquinolates. We have confirmed that these materials can be sublimed cleanly.

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign.

Group 3

In another embodiment of the present invention, the solvation effect of DCM2 laser dye molecules doped into active layers of organic light emitting devices were observed using the two OLED structures shown in FIG. 1. Structure A corresponds to a conventional OLED in which excitons are generated in the aluminum tris(8-hydroxyquinoline) ($Alq_3$) electron transport layer (ETL), C. W. Tang, S. A. VanSlyke and C. H. Chen, *Journal of Applied Physics* 65, 3610 (1989). In structure B, excitons are generated in the hole transport layer (HTL) due to the presence of the hole blocking layer bathocouprine (BCP). The HTL is comprised of either N,N'-diphenyl-N,N'-bis[3-methylphenyl]-1,1'-biphenyl-4,4'-diamine (TPD), as shown by the chemical structure:

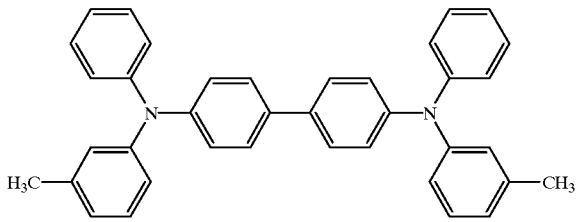

4,4'-bis[N-(1-naphthyl)-N-phenyl-amino]biphenyl(α-NPD); or a mixture of TPD and Alq$_3$. Förster energy transfer from these active host layers to DCM2 dopant generates luminescence spectra that vary from yellow to red depending on the host and DCM2 concentration.

All devices were grown by high vacuum ($10^{-6}$ to $10^{-8}$ Torr) thermal evaporation on the surface of ITO-coated glass substrate. Prior to deposition, substrates were cleaned by an ultrasonic rinse in a detergent solution, followed by solvent cleaning in 1,1,1-trichloroethylene, acetone, and boiling propanol. The organic devices, as shown in FIG. 11, were layered as follows: For structure A, a 400 Å thick α-NPD HTL was deposited, followed by a 300 Å thick Alq$_3$ layer doped with from 0.5% to 6% by mass of DCM2, and a 100 Å thick Alq$_3$ cap layer. The cathode, which was comprised of a 400 Å thick 25:1 Mg:Ag alloy and a 700 Å thick Ag layer was then deposited through a shadow mask defining one mm diameter circular electrode. For structure B, first a 100 Å thick α-NPD or TPD HTL was deposited, followed by a 300 Å thick DCM2-doped HTL, a 100 Å thick DCP, a 300 Å thick Alq$_3$ layer, and the same cathode as in A. The thickness of all devices was held constant at ~800 Å and the refractive index of both doped and undoped organic layers was in the range of 1.7 to 1.8, thus ensuring minimum variations due to microcavity effects V. Bulović, V. B. Khalfin, G. Gu, P. E. Burrows and S. R. Forrest, Physical Review (1998), Bulović I. For all layers, typical deposition rates ranged from 1 to 5 Å/s, although dopant rates were as small as 0.05 Å/s. Tri-evaporation of the mixed TPD:Alq$_3$:DCM2 layer was controlled by positioning separate thickness monitors next to each of the sources so to simultaneously monitor individual deposition rates. The combined thickness was measured by a main thickness monitor placed next to the substrate. This monitoring method allowed for reproducibly doping the host to an accuracy of about 10% by mass of the desired doping. Identical layers in all device series were deposited simultaneously to avoid device-to-device variations.

Figure 12A:
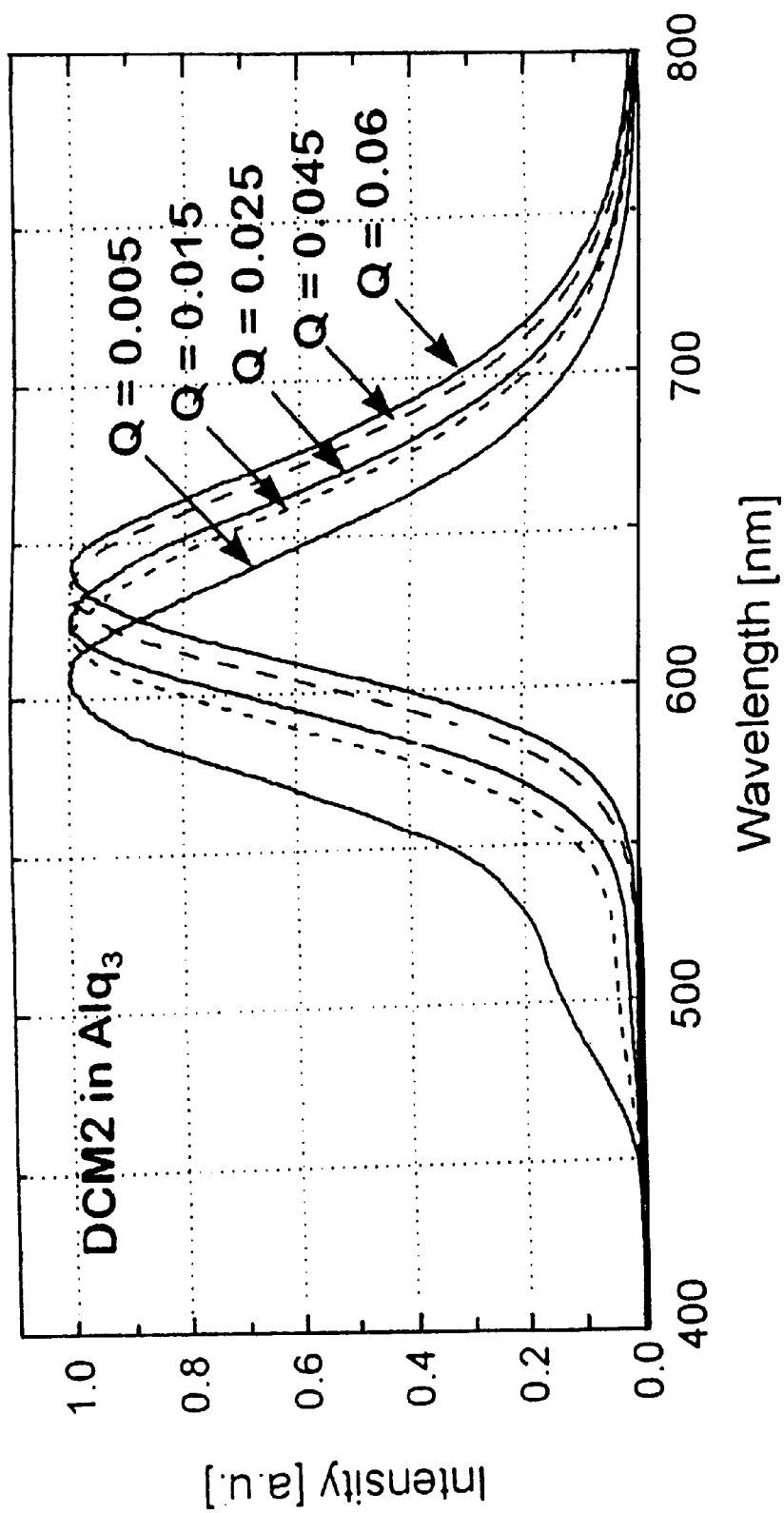
FIGS. 12A, 12B and 12C show the electroluminescence spectra of three series of doped devices where the luminescent layer is: an $Alq_3$ layer doped with DCM2 (FIG. 12A); a TPD layer doped with DCM2 (FIG. 12B); and a TPD doped with $Alq_3$ (FIG. 12C).

In the set of experiments described above in Group 1, it was shown that the EL spectrum of the polar laser dye DCM2 (with the ground state dipole moment of $\mu$=11.3 D) doped in the less polar host Alq$_3$, ($\mu$=5.5 D), can be tuned from orange-yellow to red as a function of DCM2 concentration V Bulović, A. Shoustikov, M. A. Baldo, E. Bose, V. G. Kozlov, M. E. Thompson, and S. R. Forrest., Chemical Physics Letters 287, 455 (1998), Bulović I. In FIG. 12A, results are shown for which this experiment is reproduced using OLED structure A in order to more tightly control the doping fraction of DCM2. The EL peak shifts from $\lambda_{max}$=605 nm for 0.5% DCM2 in Alq$_3$ (with doping fraction, Q=0.005), to $\lambda_{max}$=640 nm for Q=0.06, while the PL of the neat DCM2 thin film is shifted to $\lambda_{max}$ 685 nm, Bulović I.

All OLEDs in this set of experiments produced similar spectral widths. Since additional excimer peaks are not observed, it was concluded that DCM2 suspended in a solid matrix of Alq$_3$ undergoes an energy shift due to self-polarization. That is, as the DCM2 concentration in the less polar Alq$_3$ is increased, the distance between nearest-neighbor, highly-polar, DCM2 molecules decreases, thereby increasing the local polarization field. This polarization results in a bathochromic (red) shift in DCM2 emission, as previously demonstrated for the related laser dye DCM 1, which exhibits a strong PL red-shift when present in a highly polar solution (see for example Ref 10). Indeed, DCM2 solution photoluminescence (PL) spectra demonstrate similar behavior where $\lambda_{max}$ red-shifts with solvent polarity, varying from 565 nm for the nonpolar solvent, benzene, to 675 nm for dimethylsufoxide (DMSO) with the dipole moment of 3.9 D Bulović I. In thin films the bathochromic shift increases until the DCM2 concentration is 100% in an undiluted film, where $\lambda_{max}$ is close to that attained in the polar solvent DMSO.

The self-polarization of DCM2 due to dipole-dipole interactions can, thus, strongly influence the energy levels of the molecules. Relying on the qualitative treatment of the phenomenon, it may be concluded that the dipole moment of the excited DCM2 molecule is higher than that of the ground state, consistent with earlier measurements and calculations of the dipole moment of DCM1, M. M. Martin, P.Plaza and Y. H. Meyer, ChemicalPhysics 192, 367 (1995).

Figure 11A:
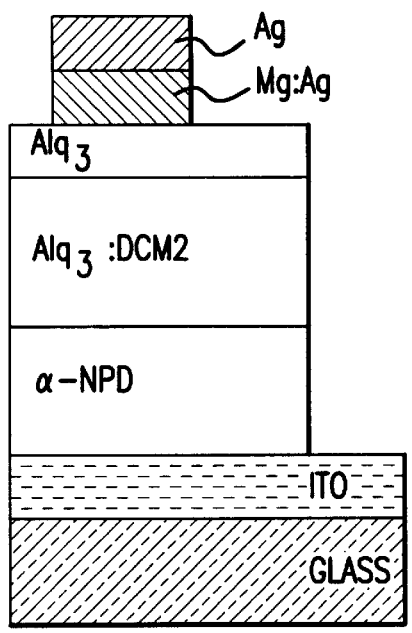
FIG. 11 shows Structure A: A conventional OLED with an exciton recombination zone in the DCM2-doped $Alq_3$ electron transport layer (ETL); and Structure B: An OLED with an exciton recombination zone in the DCM2-doped hole transport layer (HTL).
Figure 11B:
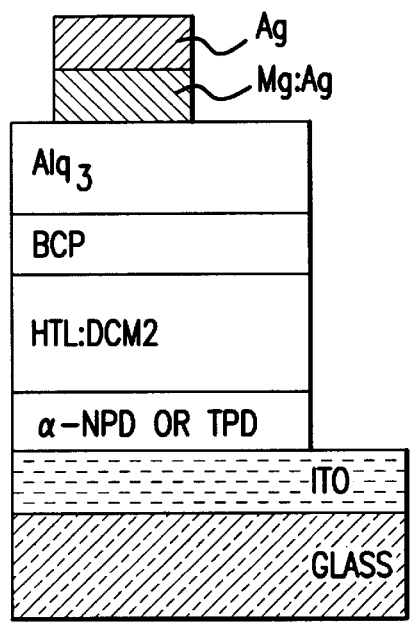
Figure 12B:
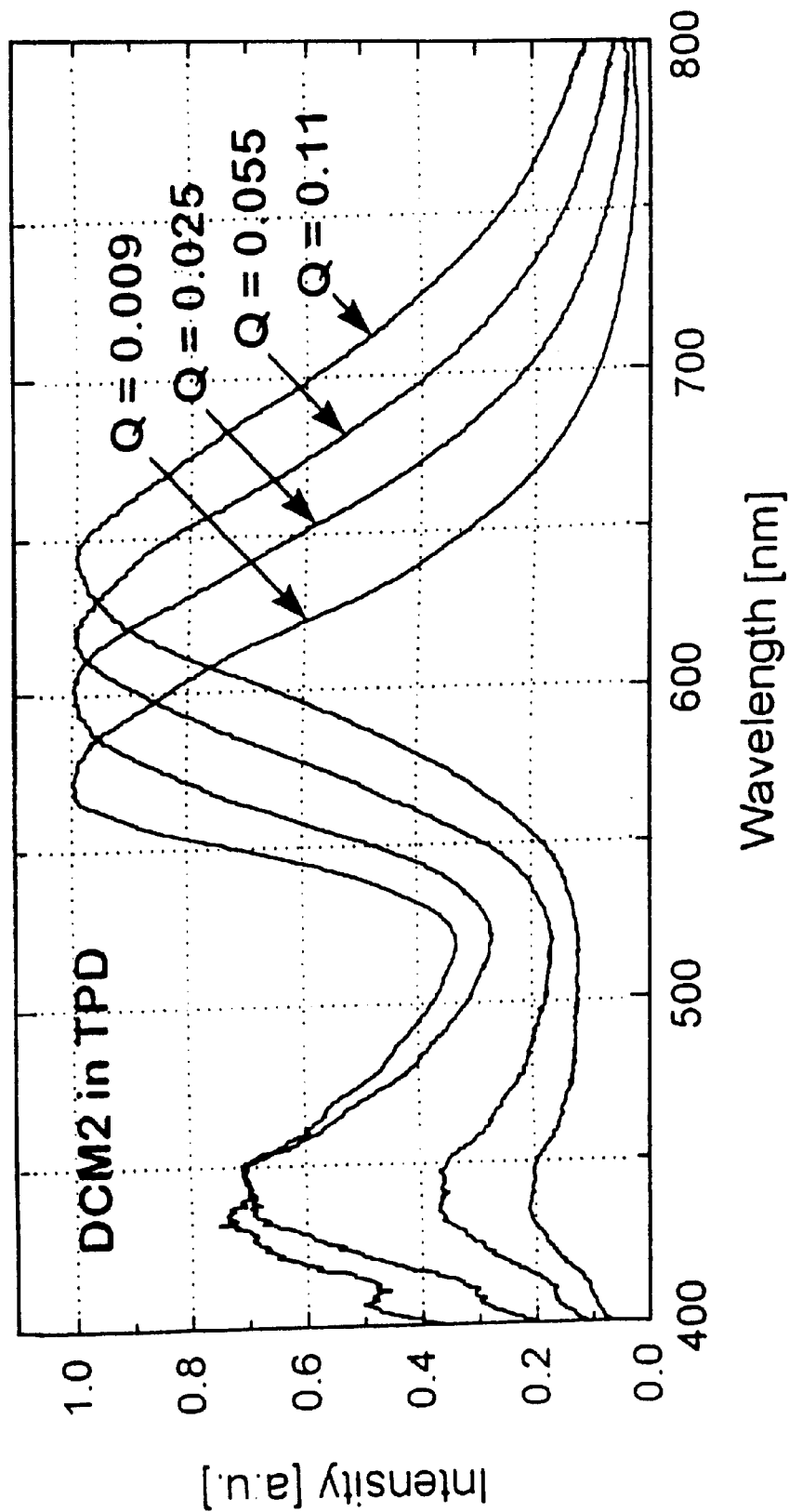

To demonstrate the general nature of the SSSE phenomenon, FIG. 12B shows the EL spectra of OLEDs with structure B wherein HTL is comprised of TPD doped with DCM2. For all spectra two energy peaks are discernible due to an incomplete Förster energy transfer from TPD (where the excitons are formed) to DCM2. The lower energy (longer wavelength) peak corresponds to DCM2 and undergoes a bathochromic shift from $\lambda_{max}$=570 nm for 0.9% DCM2 in TPD (Q=0.009) to $\lambda_{max}$=645 nm for Q=0.11. The higher energy (shorter wavelength) peak at $\lambda$=440 nm corresponds to TPD. This spectral peak shows no chromic shift with a change of the average dipole moment, since TPD molecules are symmetric and non-polar (see FIG. 11) and the dipole moment of both their ground and excited state is close to zero.

At the lowest doping, DCM2 molecules are sufficiently far apart that the average local dipole moment corresponds to that of the host. Since for the TPD host the average dipole moment is expected to be close to zero, at low doping, $\lambda_{max}$ of DCM2 in TPD is similar to $\lambda_{max}$ of DCM2 solution in benzene. In contrast, $\lambda_{max}$ of DCM2 in Alq$_3$ is red shifted by about 30 nm for comparable dopings due to the non-zero dipole moment of Alq$_3$ molecules.

Figure 12C:
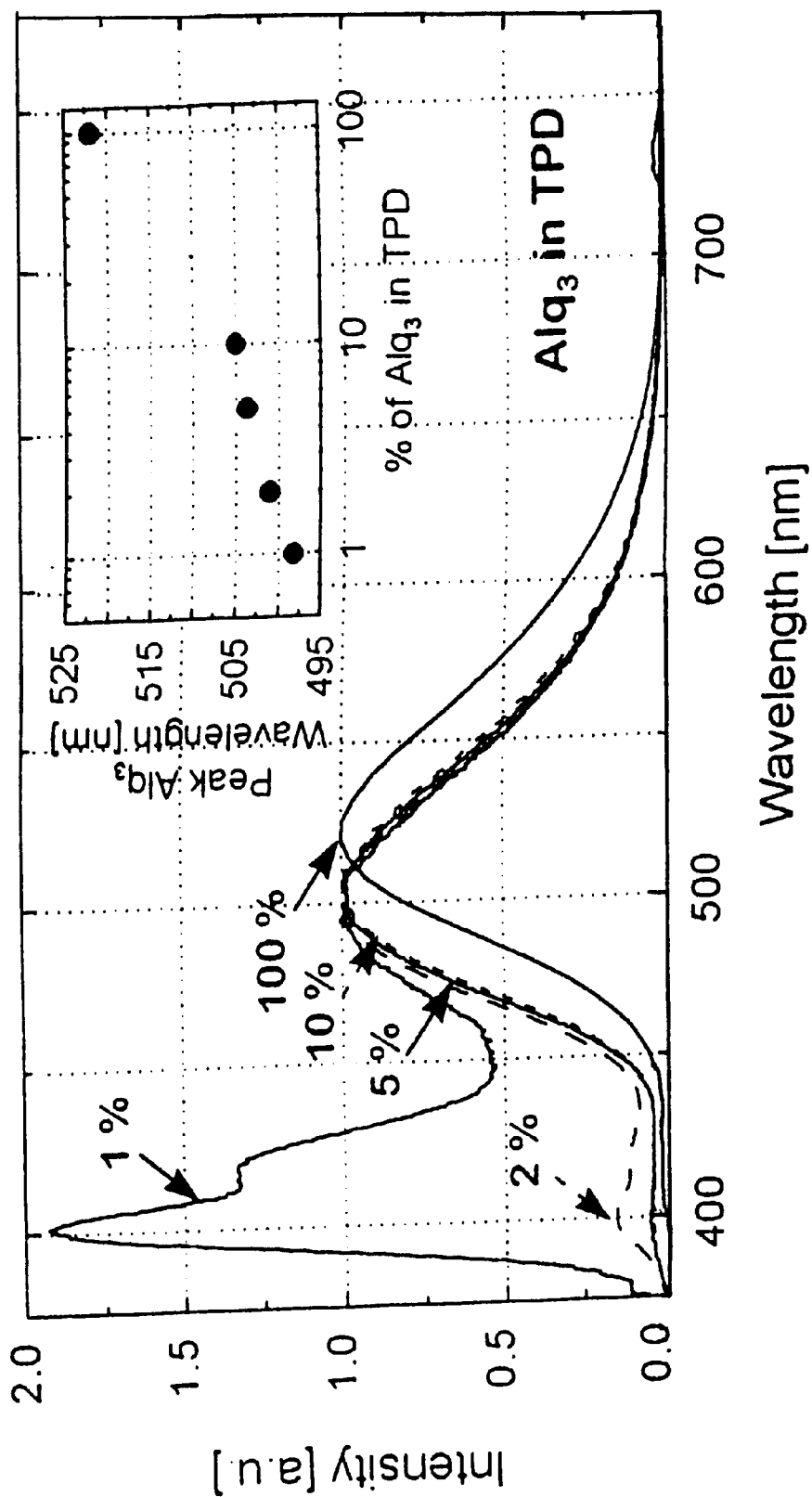

The SSSE also affects the luminescence spectrum of neat Alq$_3$ films, as evident in FIG. 12C, where the PL spectra of Alq$_3$ doped in TPD are plotted. The inset shows that with an increase of Alq$_3$ concentration in a TPD:Alq$_3$ mixed film, the $\lambda_{max}$ of Alq$_3$ shifts from 498 line to 522 nm. The luminescence spectrum of Alq$_3$ monomers is therefore aqua-green in appearance and is red-shifted to green emission in thin films due to dipole-dipole interaction with neighboring molecules. This same effect could explain the spectral emission of methylated-Alq$_3$ (Almq$_3$) thin films, J. Kido and Y. Lizumi, Applied physics Letters 73, 2721 (1998), which is similar in shape to that of Alq$_3$, but peaks at a $\lambda_{max}$ of about 500 nm. The dipole-dipole interaction between neighboring Almq$_3$ molecules should be smaller since the intermolecular spacing is likely larger due to steric hindrance of CH$_3$ groups. Hence, Almq$_3$ emission is expected to be blue shifted with respect to the Alq$_3$ thin film spectrum, as observed.

Figure 13:
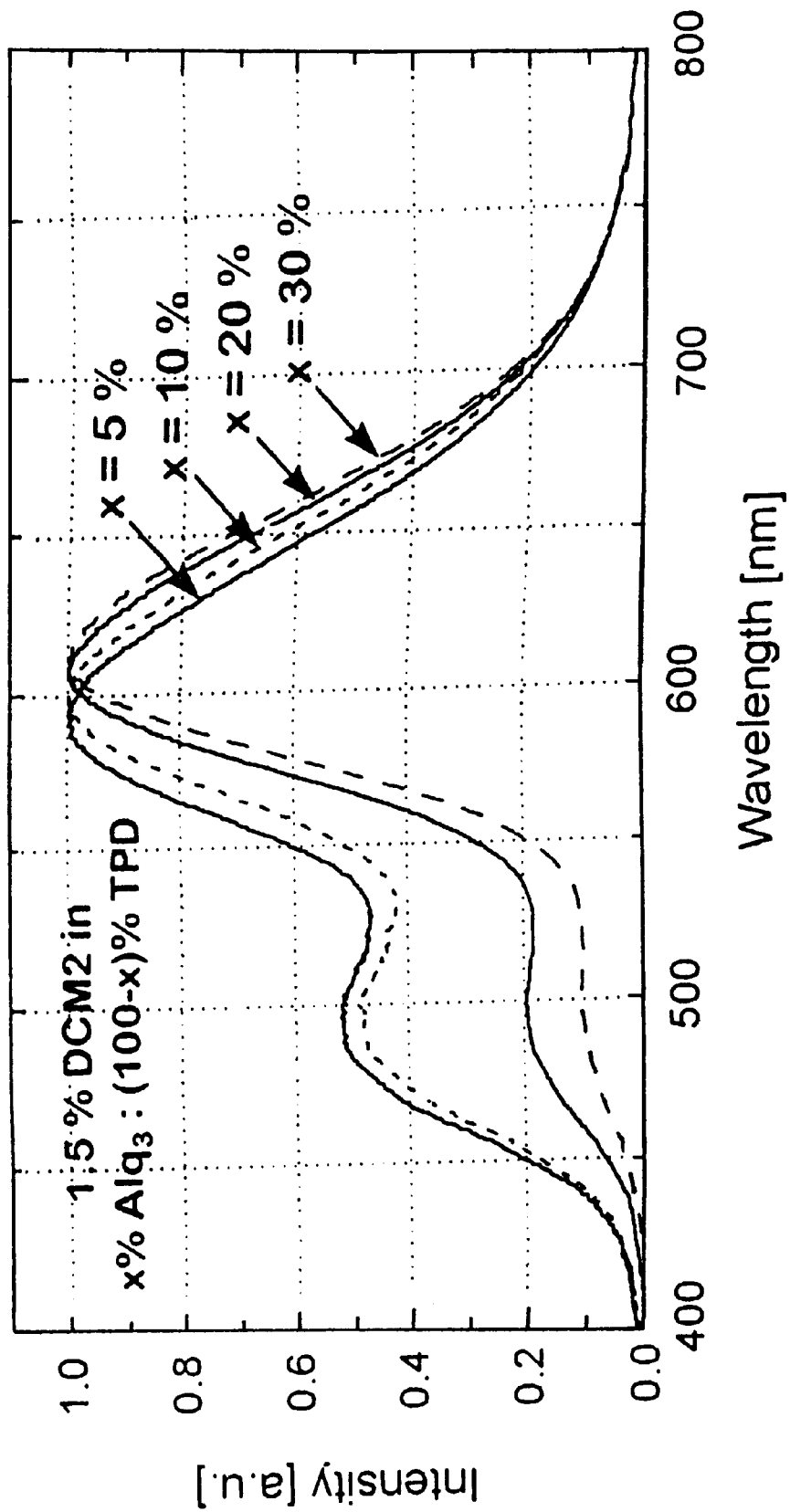
FIG. 13 shows the electroluminescence spectra of a series of devices of structure B with HTL comprised of a mixture of $Alq_3$ and TPD, which is doped with 1.5% DCM2. The HTL fraction comprised of $Alq_3$ is indicated.
Figure 14A:
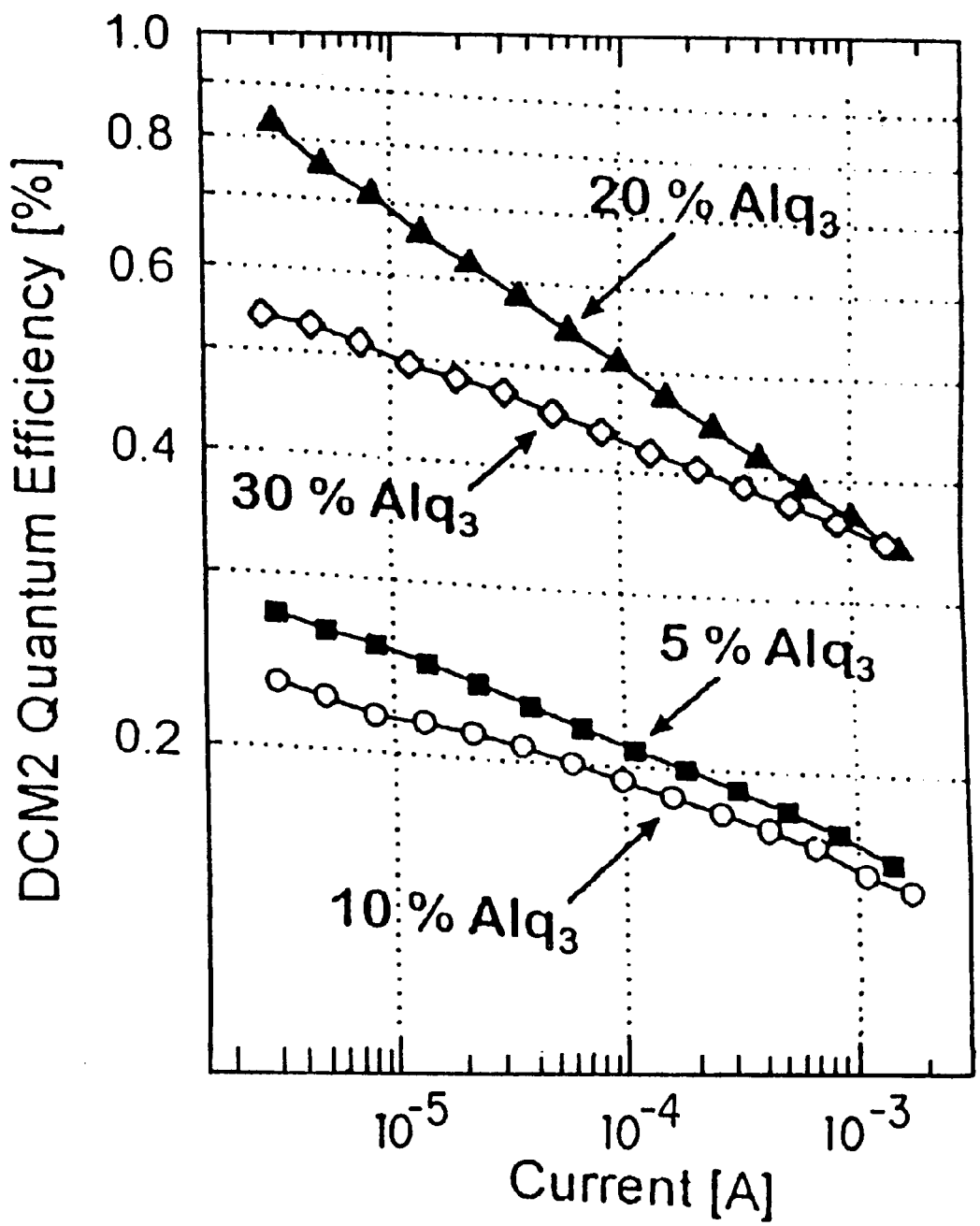
FIG. 14A shows the luminescence quantum efficiency of DCM2 emission vs. current.

In the OLEDs of FIGS. 11A and 11B, DCM2 performed the dual role of functioning both as the luminescent center and as the source of the local dipole moment. An increase in concentration of DCM2 was necessary to generate a higher local dipole moment. Unfortunately, increased doping also led to DCM2 aggregation and a concomitant decrease in OLED luminescent quantum efficiency. It is, therefore, desirable to separate the functional properties of the luminescence center and the polarization source by assigning them to two separate dopants. This is accomplished in a series of OLEDs of structure B with a mixed TPD:Alq$_3$:DCM2 HTL. DCM2 is retained as a luminescence center while Alq$_3$ is introduced in the TPD host in order to generate the local dipole moment. FIG. 13 shows the EL spectra or a series of these devices with fixed DCM2 doping of Q=0.015 in the mixed host comprised of x% Alq$_3$ and (100-x)% TPD. Two spectral peaks are observed where the lower energy peak corresponds to DCM2 and the higher energy peak to Alq$_3$ emission. The DCM2 luminescence shows a bathochromic shift from $\lambda_{max}$=597 nm at x=5% to $\lambda_{max}$=614 nm at x~30%. Meanwhile, peak Alq$_3$ emission at $\lambda_{max}$~500 nm changes minimally, as expected from the data of FIG. 12C. The Alq$_3$ peak decreases in intensity with increase in x, due to the cascade energy transfer, Berggren, from TPD to Alq$_3$ to DCM2. For low x, the Alq$_3$ to DCM2 distance is likely large and excitons can recombine on Alq$_3$ molecules before transferring to DCM2. For larger x, Alq$_3$ emission decreases since excitons can now more efficiently transfer to DCM2. Indeed, FIG. 14A plots of DCM2 luminescence quantum efficiency, η, for the four devices of FIG. 13 show that the highest η is achieved when x=20%. At higher x, the efficiency declines, presumably due to concentration quenching brought about by the increased fraction of Alq$_3$ molecules.

Figure 14B:
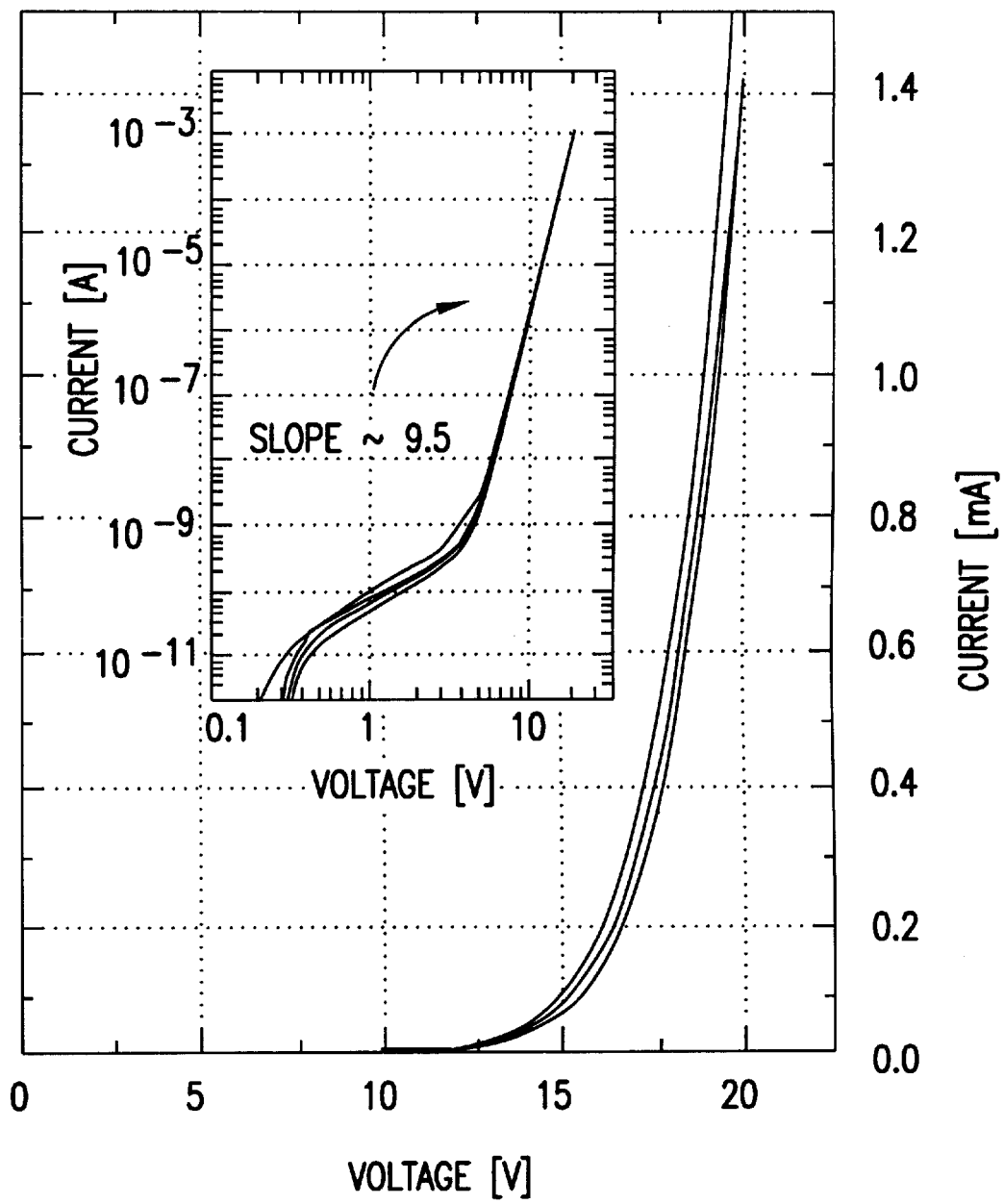
FIG. 14B shows the current-voltage characteristics of the series of devices from FIG. 13.

The forward biased current voltage (I–V) characteristics of the OLEDs shown in FIG. 14B are similar to those previously reported for conventional devises, where trap-limited conduction (I–V$^{M-1}$) is observed. For all devices, (I–V) characteristics are identical with m=9.5±1 at high applied voltage, independent of x, and lower voltages, m~2, characteristic of space-charge limited transport. Surprisingly, the high percent of Alq$_3$ in TPD does not significantly influence the (I–V) behavior of these devices.

Figure 15A:
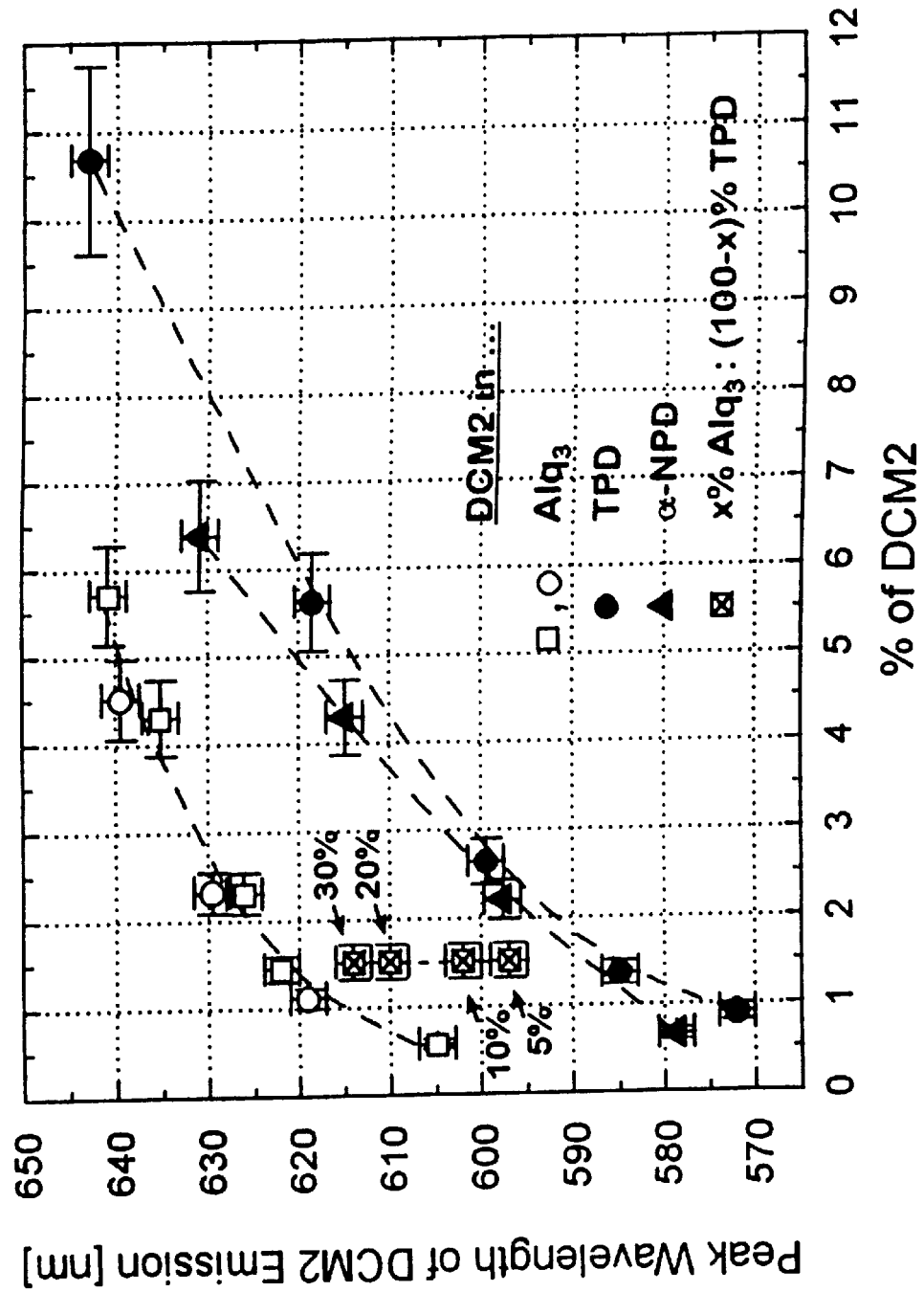
FIG. 15A shows plots summariing the results of the peak wavelength of DCM2 emission observed as a function of different host/dopant combinations.
Figure 15B:
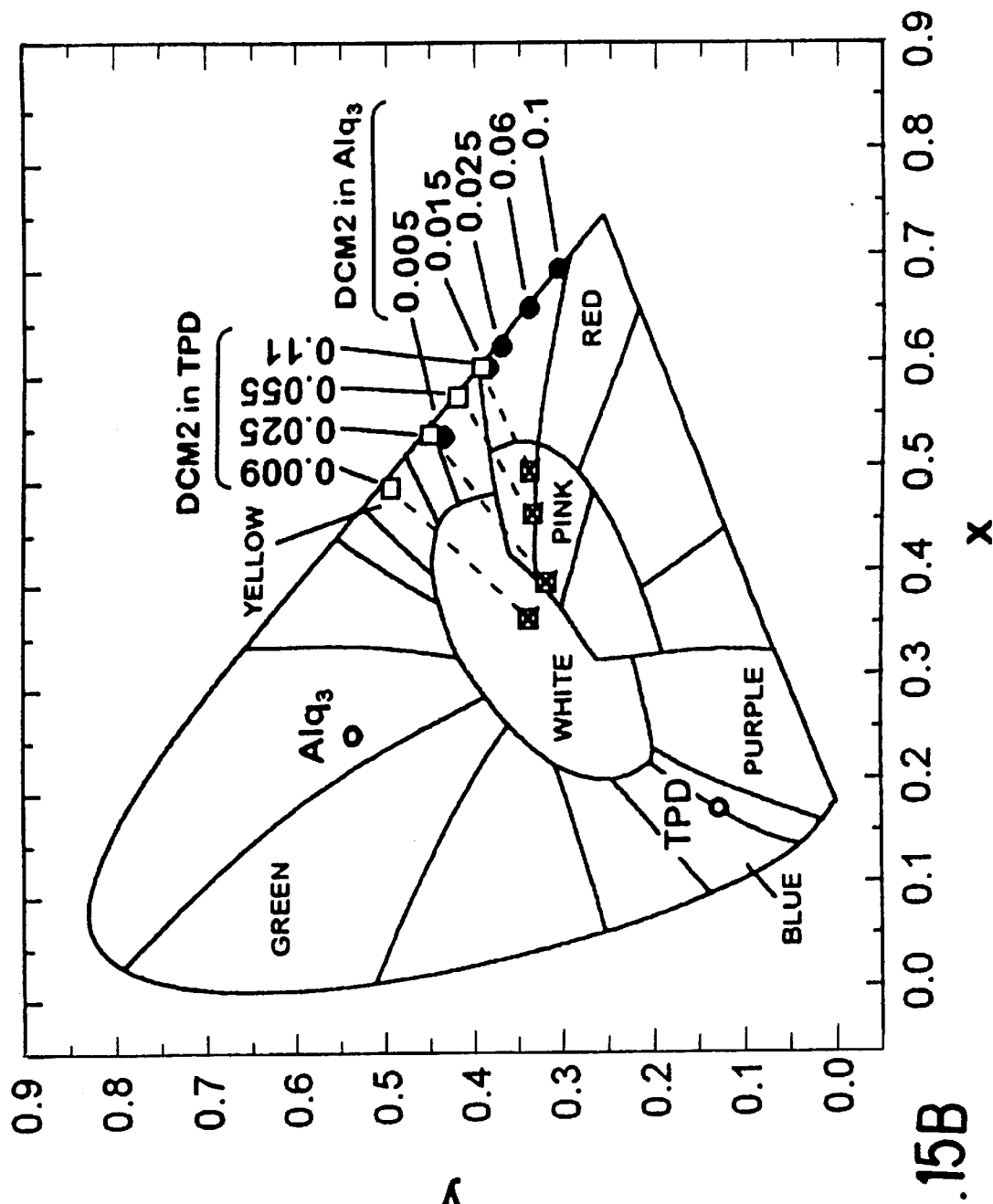
FIG. 15B shows the CIE coordinates of DCM2 spectrum as a finction of DCM2 doping for different host materials.

In FIG. 15A, measurements of DCM2 $\lambda_{max}$ in different hosts are summarized. In addition to the Alq$_3$:DCM2 and TPD:DCM2 data, the influence of SSSE on DCM2 emission in the structure B OLEDs with an α-NPD:DCM2-mixed HTL is also shown. Since α-NPD is non-polar, dependence of $\lambda_{max}$ on DCM2 doping in this host is similar to that of the TPD:DCM2 devices.

The DCM2 spectral emission in dual doped TPD:Alq$_3$:DCM2 OLEDs can be tuned between $\lambda_{max}$=590 nm and $\lambda_{max}$=620 mn, corresponding to x=0% and x=100% for a fixed DCM2 fraction of Q=0.015. Therefore, these results demonstrate the continual tuning of the luminescent spectrum by introduction of a second polar dopant while keeping a low DCM2 concentration. This indicates that SSSE can broadly tune the spectral emission of this mixed material system.

In conclusion, these results demonstrate that molecular polarization effects in small-molecular-weight organic thin films can significantly influence the emission spectra of the luminescent molecules. It has been shown that the solid state solvation effect can be utilized to optimize the OLED emission color, shifting the peak of the EL spectrum by as much as 70 nm for a Alq$_3$:TPD luminescent layer. With this same material system, bright, efficient and saturated red, or orange, and yellow OLEDs can be achieved. Luminescent efficiency was improved by dual doping of the host layer which resulted in a cascade energy transfer.

What is claimed is:

1. An organic light emitting device comprising a heterostructure for producing luminescence wherein said heterostructure includes an emissive layer comprising:
   a host material;
   an emissive material present as a dopant in said host material; and
   a polarization material present as a dopant in said host material, wherein said polarization material contributes to the local dipole moment of said emissive layer and thereby affects the wavelength of light emitted by said emissive material and wherein said polarization material is not the same material as said emissive material;
   wherein said host material, said emissive material and polarization material are selected in combination so as to produce an emission peak in a prescribed spectral region when a voltage is applied across the heterostructure.

2. The organic light emitting device of claim 1, wherein said emissive layer is a hole transporting layer.

3. The organic light emitting device of claim 1, wherein said emissive layer is an electron transporting layer.

4. The organic light emitting device of claim 1, wherein said host material is comprised of N,N'-diphenyl-N,N'-bis(3-methylphenyl)-1,1'-biphenyl-4,4'-diamine (TPD) having the chemical structure:

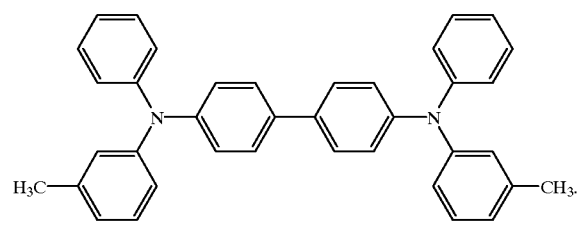

5. The organic light emitting device of claim 1, wherein said polarization material provides cascade energy transfer from said host material to said emissive material when said voltage is applied across said heterostructure.

6. The organic light emitting device of claim 1, wherein said polarization material is comprised of tris-(8-hydroxyquinoline)-aluminum (ALq$_3$).

7. The organic light emitting device of claim 1, wherein said emissive material is comprised of DCM2, wherein DCM2 has the chemical structure:

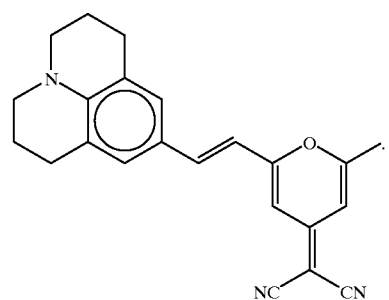

8. The organic light emitting device of claim 1, wherein said host material is comprised of N,N'-diphenyl-N,N'-bis(3-methylphenyl)-1,1'-biphenyl-4,4'-diamine (TPD) having the chemical structure:

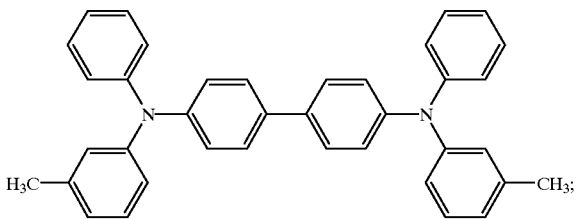

wherein said polarization material is comprised of tris-(8-hydroxyquinoline)-aluminum (Alq$_3$); and said emissive material is comprised of DCM2, wherein DCM2 has the chemical structure:

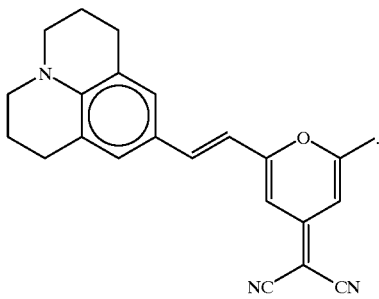

9. The organic light emitting device of claim 1, wherein said host material is comprised of a vacuum deposited material.

10. The organic light emitting device of claim 1, wherein said host material is comprised of a polymeric material.

11. The organic light emitting device of claim 1, wherein said emissive material is comprised of a polymeric material.

12. A display incorporating the organic light emitting device of claim 1.

13. A vehicle incorporating the organic light emitting device of claim 1.

14. A computer incorporating the organic light emitting device of claim 1.

15. A television incorporating the organic light emitting device of claim 1.

16. A printer incorporating the organic light emitting device of claim 1.

17. A device selected from the group consisting of a large area wall, a theater and a stadium screen, incorporating the organic light emitting device of claim 1.

18. A billboard incorporating the organic light emitting device of claim 1.

19. A sign incorporating the organic light emitting device of claim 1.

20. A method of fabricating an organic light emitting device comprising:

fabricating a heterostructure for producing luminescence wherein said heterostructure includes an emissive layer comprising a host material and an emissive material present as a dopant in said host material and a polarization material present as a dopant in said host material, wherein said polarization material contributes to the local dipole moment of said emissive layer and thereby affects the wavelength of light emitted by said emissive material and wherein said polarization material is not the same material as said emissive material;

wherein the fabrication process includes the step of selecting said host material, said emissive material and said polarization material in combination such that the heterostructure produces an emission peak in a prescribed spectral region when a voltage is applied across the heterostructure.

21. A method for tuning the color ofthe electroluminescence of an organic light emitting device comprising:

fabricating a heterostructure for producing luminescence wherein said heterostructure includes a chromophore and a polarization material that is different than said chromophore in an emissive layer and wherein the fabrication process includes the step of adjusting the average dipole moment experienced by said chromophore so as to produce an emission peak in a prescribed spectral region when a voltage is applied across the heterostructure.

* * * * *

UNITED STATES PATENT AND TRADEMARK OFFICE
CERTIFICATE OF CORRECTION

PATENT NO. : 6,312,836 B1
DATED : November 6, 2001
INVENTOR(S) : Bulovic et al.

It is certified that error appears in the above-identified patent and that said Letters Patent is hereby corrected as shown below:

Column 5,
Line 42, change "dimethylpaanitroaniline" to -- dimethylparanitroaniline --;
Line 43, change "polar4" to -- polar 4 --;

Column 6,
Line 60, change "polar4" to -- polar 4 --;

Column 7,
Line 53, change "summariing" to -- summarizing --;
Line 57, change "finction" to -- function --;

Column 8,
Lines 39-40, change "enviromnent" to -- environment --;
Lines 57-58, change "bathochromnic" to -- bathochromic --;

Column 9,
Line 52, change "hostldopant" to -- host/dopant --;

Column 13,
Line 1, change "flunction" to -- function --;

Column 14,
Lines 38-39, change "F orster" to -- Förster --;

Column 16,
Line 14, change "HTh" to -- HTL --;

Column 17,
Line 35, after "130," change "sepaate" to -- separate --;

UNITED STATES PATENT AND TRADEMARK OFFICE
CERTIFICATE OF CORRECTION

PATENT NO. : 6,312,836 B1
DATED : November 6, 2001
INVENTOR(S) : Bulovic et al.

It is certified that error appears in the above-identified patent and that said Letters Patent is hereby corrected as shown below:

Column 23,
Line 57, after "M=group" change "4or" to -- 4 or --; and

Column 27,
Line 53, change "620 mn" to -- 620 nm --.

Signed and Sealed this

Third Day of September, 2002

Attest:

Attesting Officer

JAMES E. ROGAN
Director of the United States Patent and Trademark Office